US010135422B2

(12) United States Patent
Goto et al.

(10) Patent No.: US 10,135,422 B2
(45) Date of Patent: Nov. 20, 2018

(54) FILTER DEVICES HAVING IMPROVED ATTENUATION CHARACTERISTICS

(71) Applicant: SKYWORKS FILTER SOLUTIONS JAPAN CO., LTD., Kadoma-Shi (JP)

(72) Inventors: Rei Goto, Osaka-Fu (JP); Joji Fujiwara, Osaka-Fu (JP); Tetsuya Tsurunari, Osaka-Fu (JP); Hiroyuki Nakamura, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 245 days.

(21) Appl. No.: 15/281,286

(22) Filed: Sep. 30, 2016

(65) Prior Publication Data

US 2017/0099043 A1 Apr. 6, 2017

Related U.S. Application Data

(60) Provisional application No. 62/384,551, filed on Sep. 7, 2016, provisional application No. 62/331,185, filed
(Continued)

(51) Int. Cl.
   *H03H 9/64* (2006.01)
   *H04L 5/14* (2006.01)
   (Continued)

(52) U.S. Cl.
   CPC ............ *H03H 9/64* (2013.01); *H03H 9/0009* (2013.01); *H03H 9/6436* (2013.01);
   (Continued)

(58) Field of Classification Search
   CPC ...... H03H 9/64; H03H 9/6483; H03H 9/6436; H03H 9/725; H03H 9/0009; H04L 5/14
   See application file for complete search history.

(56) References Cited

U.S. PATENT DOCUMENTS 4,799,029 A * 1/1989 Minomo .................. H03B 5/32
   331/107 A
4,906,885 A * 3/1990 Kojima ................... H01L 41/29
   310/313 B
(Continued)

FOREIGN PATENT DOCUMENTS

JP   S62261211 A   11/1987
JP   H09312587 A   12/1997
(Continued)

*Primary Examiner* — Lewis West
(74) *Attorney, Agent, or Firm* — Lando & Anastasi, LLP

(57) ABSTRACT

A filter device having improved attenuation and isolation characteristics. In one example the filter device has a common terminal, a first terminal, and a second terminal, and includes a first filter connected between the common terminal and the first terminal, a second filter connected between the common terminal and the second terminal, and an additional circuit including at least three IDT electrodes each connected to a respective one of a corresponding at least three connection points within the filter device, the at least three connection points being selected from a group consisting of the common terminal, the first terminal, the second terminal, a first node disposed between the plurality of first filter elements along a path extending between the common terminal and the first terminal, and a second node disposed between the plurality of second filter elements along a path extending between the common terminal and the second terminal.

20 Claims, 15 Drawing Sheets

Related U.S. Application Data on May 3, 2016, provisional application No. 62/235,820, filed on Oct. 1, 2015.

(51) Int. Cl.
*H03H 9/00* (2006.01)
*H03H 9/72* (2006.01)

(52) U.S. Cl.
CPC .......... *H03H 9/6483* (2013.01); *H03H 9/725* (2013.01); *H04L 5/14* (2013.01)

(56) References Cited

U.S. PATENT DOCUMENTS

| | | | | |
|---|---|---|---|---|
| 5,666,091 | A * | 9/1997 | Hikita | H03H 9/6433 310/313 A |
| 5,682,126 | A * | 10/1997 | Plesski | H03H 9/0028 310/313 R |
| 5,864,262 | A * | 1/1999 | Ikada | H03H 9/6433 310/313 B |
| 5,905,418 | A | 5/1999 | Ehara et al. | |
| 5,994,980 | A * | 11/1999 | Tada | H03H 9/0028 310/313 R |
| 6,049,260 | A * | 4/2000 | Yoshimoto | H03H 9/25 310/313 D |
| 6,262,637 | B1 | 7/2001 | Bradley et al. | |
| 6,404,302 | B1 | 6/2002 | Satoh et al. | |
| 6,677,835 | B2 | 1/2004 | Noguchi et al. | |
| 7,084,718 | B2 * | 8/2006 | Nakamura | H03H 9/02118 333/133 |
| 7,733,196 | B2 | 6/2010 | Tsurunari et al. | |
| 7,941,103 | B2 | 5/2011 | Iwamoto et al. | |
| 8,174,339 | B2 | 5/2012 | Matsuda et al. | |
| 8,228,137 | B2 | 7/2012 | Inoue et al. | |
| 8,378,760 | B2 | 2/2013 | Iwaki et al. | |
| 8,618,992 | B2 | 12/2013 | Fujiwara et al. | |
| 9,118,303 | B2 | 8/2015 | Inoue | |
| 9,219,467 | B2 | 12/2015 | Inoue et al. | |
| 9,246,533 | B2 | 1/2016 | Fujiwara et al. | |
| 2004/0246077 | A1 * | 12/2004 | Misu | H03H 7/0115 333/195 |
| 2007/0024392 | A1 * | 2/2007 | Inoue | H03H 9/0576 333/133 |
| 2007/0090895 | A1 | 4/2007 | Nishizawa et al. | |
| 2008/0238572 | A1 * | 10/2008 | Funami | H03H 9/725 333/133 |
| 2010/0026419 | A1 | 2/2010 | Nara et al. | |
| 2010/0109802 | A1 * | 5/2010 | Tanaka | H03H 9/725 333/133 |
| 2010/0150075 | A1 | 6/2010 | Inoue et al. | |
| 2010/0194494 | A1 * | 8/2010 | Inoue | H03H 7/42 333/133 |
| 2011/0199169 | A1 * | 8/2011 | Kadota | H03H 9/02653 333/195 |
| 2011/0254639 | A1 | 10/2011 | Tsutsumi et al. | |
| 2012/0119847 | A1 | 5/2012 | Iwaki et al. | |
| 2013/0113576 | A1 * | 5/2013 | Inoue | H03H 9/6433 333/133 |
| 2013/0214873 | A1 * | 8/2013 | Takamine | H03H 9/0576 333/133 |
| 2016/0105158 | A1 * | 4/2016 | Fujiwara | H04B 1/40 333/133 |
| 2017/0093373 | A1 * | 3/2017 | Fujiwara | H04B 1/40 |
| 2017/0331456 | A1 | 11/2017 | Ono | |

FOREIGN PATENT DOCUMENTS

| | | |
|---|---|---|
| JP | 2002158599 A | 5/2002 |
| JP | 2004242280 A | 8/2004 |
| JP | 2006311041 A | 11/2006 |
| JP | 2007124085 A | 5/2007 |
| JP | 2010041141 A | 2/2010 |
| JP | 2010154437 A | 7/2010 |
| JP | 2011160203 A | 8/2011 |
| JP | 2012109818 A | 6/2012 |
| JP | 2013-048491 A | 3/2013 |
| JP | 2013118611 A | 6/2013 |
| WO | 2009025106 A1 | 2/2009 |
| WO | 2010073377 A1 | 7/2010 |

\* cited by examiner

FILTER DEVICES HAVING IMPROVED ATTENUATION CHARACTERISTICS

CROSS-REFERENCE TO RELATED APPLICATIONS

This application claims the benefit under 35 U.S.C. § 119(e) of U.S. Provisional Application Nos. 62/235,820 titled "BRANCHING FILTER DEVICES" filed on Oct. 1, 2015, 62/331,185 titled "FILTER DEVICES" filed on May 3, 2016, and U62/384,551 titled "FILTER DEVICES" filed on Sep. 7, 2016, each of which is herein incorporated by reference in its entirety for all purposes.

BACKGROUND

Communications devices, such as mobile phones and the like, use filters and sub-systems incorporating filters (such as duplexers, diplexers, and the like) to separate signals in different frequency bands, such as transmission and reception signals, for example. There has been a trend for such devices to be miniaturized and to have a reduced overall part count. Furthermore, it is desirable for the attenuation characteristics of the filters, and isolation between different filters, to be improved.

FIG. 1 is a schematic diagram illustrating a conventional filter device, such as is disclosed in U.S. PG-Pub No. 2013/0113576, for example. The filter device 100 includes a first filter 110 having a first passband and connected between a common terminal 101 and a transmission terminal 102, and a second filter 120 having a second passband and connected between the common terminal 101 and a reception terminal 103. This type of filter device can be used as a duplexer, for example. The filter device 100 further includes a longitudinal-coupling-type acoustic wave resonator or acoustic wave delay line 130 including three Interdigital Transducer (IDT) electrodes and connected between the transmission terminal 102 and the reception terminal 103. In addition, a first capacitor 105 can be interposed between the transmission terminal 102 and the longitudinal-coupling-type acoustic wave resonator or acoustic wave delay line 130, and a second capacitor 106 can be interposed between the reception terminal 103 and the longitudinal-coupling-type acoustic wave resonator or acoustic wave delay line 130. In this filter device 100, the longitudinal-coupling-type acoustic wave resonator or acoustic wave delay line 130 can provide a cancelling circuit for cancelling out signal leakage from the transmission terminal 102 to the reception terminal 103 to improve the isolation characteristics of the filter device 100.

When a temperature-compensation-type surface acoustic wave element (TC-SAW) is used for the resonator(s) forming the first filter 110 and/or the second filter 120 in the conventional filter device as shown in FIG. 1, a higher-order mode may occur in a frequency band that is 1.2 to 1.3 times greater than the center frequency of a main mode of the relevant filter. Because this frequency band can be used for communication via carrier aggregation (CA), it is desirable to suppress the higher-order mode, and therefore the attenuation characteristics of the filter device 100 need to be further improved to achieve the desired suppression.

SUMMARY OF THE INVENTION

Aspects and embodiments relate to filter devices for use in a communications device such as a mobile phone and the like.

As discussed above, in recent years there has been an ongoing effort to continue to reduce the size and overall part count in communication devices such as mobile phones and the like. Furthermore, it is desirable to have even further improvement in the attenuation and isolation characteristics of filter devices that are used in such mobile communications devices. In order to address the aforementioned problems, aspects and embodiments are directed to a filter device incorporating a circuit designed to improve the attenuation characteristics of at least one filter with which the circuit is associated. The circuit may further improve the isolation characteristics of a duplexer or diplexer in which it is used.

According to one embodiment, a filter device has a common terminal, a first terminal, and a second terminal, and comprises a first filter including a plurality of first filter elements connected in series between the common terminal and the first terminal, a second filter including a plurality of second filter elements connected in series between the common terminal and the second terminal, and an additional circuit including at least three interdigital transducer (IDT) electrodes each connected to a respective one of a corresponding at least three connection points within the filter device, the at least three connection points being selected from a group consisting of the common terminal, the first terminal, the second terminal, a first node disposed between the plurality of first filter elements along a path extending between the common terminal and the first terminal, and a second node disposed between the plurality of second filter elements along a path extending between the common terminal and the second terminal.

The at least three IDT electrodes may preferably constitute a longitudinal-coupling-type acoustic wave resonator or an acoustic wave delay line.

In certain examples, the at least three connection points may include the common terminal, the first terminal and the second terminal. The filter device may further include at least one of a first capacitor connected between the common terminal and the additional circuit, a second capacitor connected between the first terminal and the additional circuit, and a third capacitor connected between the second terminal and the additional circuit. The second capacitor can be disposed physically closer to the first terminal than a midpoint of a connection wiring extending between the first terminal and the additional circuit. The third capacitor can be disposed physically closer to the second terminal than a midpoint of a connection wiring extending between the second terminal and the additional circuit.

The first filter preferably may be a ladder-type filter or a longitudinal-coupling-type filter. The second filter also preferably may be a ladder-type filter or a longitudinal-coupling-type filter.

In certain examples the additional circuit includes three IDT electrodes. The three IDT electrodes may include a first IDT electrode connected to the common terminal, a second IDT electrode connected to the first terminal, and a third IDT electrode connected to the second terminal. The first and third IDT electrodes can be disposed in an electrode polarity direction opposed to that of the second IDT electrode. The first, second, and third IDT electrodes may be disposed in the same electrode polarity direction.

In other examples the additional circuit includes four IDT electrodes. The four IDT electrodes may include a first IDT electrode connected to the first terminal, a second IDT electrode connected to the common terminal, a third IDT electrode connected to the second terminal, and a fourth IDT electrode connected to the first terminal. The first and fourth IDT electrodes preferably may be disposed in an electrode polarity direction which is opposite to that of the second and third IDT electrodes.

In other examples the additional circuit includes five IDT electrodes. The five IDT electrodes may include a first IDT electrode connected to the common terminal, a second IDT electrode connected to the first terminal, a third IDT electrode connected to the common terminal, a fourth IDT electrode connected to the first terminal, and a fifth IDT electrode connected to the second terminal. The first to fourth IDT electrodes preferably may be disposed in an electrode polarity direction which is opposite to that of the fifth IDT electrode.

The additional circuit may be connected to the first terminal via a single point disposed inside the first filter. At least one of the first and second filters may include a surface acoustic wave element, a propagation direction of an acoustic wave generated inside the additional circuit being different from that of an acoustic wave generated from the at least one of the first and second filters.

The additional circuit may include reflectors disposed outside the IDT electrodes. The reflectors may be disposed obliquely with respect to a polarity direction of the IDT electrodes. The additional circuit may include an acoustic absorber disposed outside the IDT electrodes. The additional circuit may include a floating electrode disposed outside the IDT electrodes. An IDT electrode included in the additional circuit may have quantities of a metallization ratio η and a film thickness, at least one of the quantities being different from at least one corresponding quantity of an IDT electrode included in the first or second filter.

The filter device may further include at least one of a first inductor component connected between the common terminal and the additional circuit, a second inductor component connected between the first terminal and the additional circuit, and a third inductor component connected between the second terminal and the additional circuit. In one example the first, second, and third inductor components are formed by bent portions formed in a connection wiring routed to the additional circuit. In another example the first inductor component, the second inductor component, and the third inductor component are formed by width-varying portions formed in a connection wiring routed to the additional circuit. In another example the first inductor component, the second inductor component, and the third inductor component are formed by film-thickness-varying portions formed in a connection wiring routed to the additional circuit.

In addition, the additional circuit may have a pitch of the IDT electrode fingers, which is 1/1.2 to 1/1.3 times the pitch of the IDT electrode fingers of the resonator included in the first filter and/or the second filter. The additional circuit may include at least four IDT electrodes.

At least portion of the first filter, the second filter, and the third filter may be formed on a substrate separated from a substrate associated with the remaining components.

According to certain embodiments, examples of the filter device can be incorporated into an antenna duplexer or diplexer.

Further embodiments are directed to modules incorporating examples of the filter device, and to communication devices (such as mobile phones and the like) incorporating examples of the filter device or modules.

Examples of the filter device according to certain embodiments can improve the attenuation characteristics of the first and second filters. Further, examples of the filter device can have improved isolation characteristics. In addition, it may be possible to simplify the circuit layout and downsize a corresponding device in which the filter is used.

According to another embodiment a communications device comprises an antenna, reception circuitry, transmission circuitry, and a duplexer module. The duplexer module may include an antenna duplexer having a first terminal connected to the transmission circuitry, a second terminal connected to the reception circuitry, and a common terminal connected to the antenna, the antenna duplexer including a first filter having a plurality of first filter elements connected in series between the common terminal and the first terminal, a second filter having a plurality of second filter elements connected in series between the common terminal and the second terminal, and an additional circuit including at least three interdigital transducer (IDT) electrodes each connected to a respective one of a corresponding at least three connection points within the filter device, the at least three connection points being selected from a group consisting of the common terminal, the first terminal, the second terminal, a first node disposed between the plurality of first filter elements along a path extending between the common terminal and the first terminal, and a second node disposed between the plurality of second filter elements along a path extending between the common terminal and the second terminal. The communications device may further comprise at least one capacitor connected between one of the at least three connection points and the additional circuit.

According to another embodiment a filter device has a common terminal, a first terminal, and a second terminal, and comprises a first filter connected between the common terminal and the first terminal, a second filter connected between the common terminal and the second terminal, and an additional circuit including a first interdigital transducer (IDT) electrode connected to the common terminal, a second IDT electrode connected to the first terminal, and a third IDT electrode connected to the second terminal. The filter device may further comprise a first capacitor connected between the first IDT electrode and the common terminal, a second capacitor connected between the second IDT electrode and the first terminal, and a third capacitor connected between the third IDT electrode and the second terminal. In one example the additional circuit further includes a fourth IDT electrode connected to the first terminal. In another example the additional circuit further includes a fifth IDT electrode connected to the common terminal.

Another embodiment is directed to a filter device having a common terminal, a first terminal, and a second terminal, the filter device comprising a first filter including a plurality of first filter elements connected in series between the common terminal and the first terminal, the first filter having a first passband, a second filter including a plurality of second filter elements connected in series between the common terminal and the second terminal, the second filter having a second passband that does not overlap the first passband, an additional circuit including at least three interdigital transducer (IDT) electrodes each connected to a respective one of a corresponding at least three connection points within the filter device, the at least three connection points being selected from a group consisting of the common terminal, the first terminal, the second terminal, a first node disposed between the plurality of first filter elements along a path extending between the common terminal and the first terminal, and a second node disposed between the plurality of second filter elements along a path extending between the common terminal and the second terminal, and at least three capacitors each connected between a respective one of the at least three connection points and the additional circuit.

In certain examples the least three capacitors include a first capacitor connected between a first connection point of the at least three connection points and the additional circuit, a second capacitor connected between a second connection point of the at least three connection points and the additional circuit, and a third capacitor connected between a third connection point of the at least three connection points and the additional circuit.

In one example of the filter device the first filter is a ladder-type filter including a plurality of series resonators connected in series along a signal line between the first terminal and the common terminal, and a plurality of parallel resonators connected between the signal line and ground. In another example the second filter includes a resonator and a longitudinal-coupling-type filter connected in series between the common terminal and the second terminal. In one example the longitudinal-coupling-type filter includes a pair of reflectors and a plurality of second filter IDT electrodes disposed between reflectors of the pair of reflectors. The plurality of second filter IDT electrodes may be surface acoustic wave elements, for example. In one example the plurality of series resonators of the first filter includes four series resonators, and the plurality of parallel resonators of the first filter includes three parallel resonators.

In one example of the filter device the at least three connection points include the common terminal, the first terminal and the second terminal. In one example the first capacitor is connected between the common terminal and the additional circuit, the second capacitor is connected between the first terminal and the additional circuit, the third capacitor is connected between the second terminal and the additional circuit, and the at least three IDT electrodes are connected to the common terminal, the first terminal and the second terminal. In another example the at least three IDT electrodes of the additional circuit include a first IDT electrode connected between the first capacitor and ground, a second IDT electrode connected between the second capacitor and ground, and a third IDT electrode connected between the third capacitor and ground. In one example the first and third IDT electrodes are disposed in an electrode polarity direction opposite to that of the second IDT electrode. In another example the first, second, and third IDT electrodes are disposed in an electrode polarity direction identical to one another.

In one example the at least three IDT electrodes of the additional circuit include a first IDT electrode connected to the first terminal, a second IDT electrode connected to the common terminal, a third IDT electrode connected to the second terminal, and a fourth IDT electrode connected to the first terminal. The first and fourth IDT electrodes may be disposed in an electrode polarity direction opposite to that of the second and third IDT electrodes.

In another example the at least three IDT electrodes of the additional circuit include a first IDT electrode connected to the common terminal, a second IDT electrode connected to the first terminal, a third IDT electrode connected to the common terminal, a fourth IDT electrode connected to the first terminal, and a fifth IDT electrode connected to the second terminal. The first to fourth IDT electrodes may be disposed in an electrode polarity direction opposite to that of the fifth IDT electrode. In one example the first capacitor is connected between the common terminal and the first IDT electrode, the second capacitor is connected between the second IDT electrode and the first terminal, and the third capacitor is connected between the second terminal and the fifth IDT electrode. The filter device may further comprise a fourth capacitor connected between the third IDT electrode and the common terminal, and a fifth capacitor connected between the fourth IDT electrode and the first terminal.

In one example of the filter device the additional circuit includes a pair of reflectors disposed outside the at least three IDT electrodes. The pair of reflectors may be disposed oblique with respect to a polarity direction of the at least three IDT electrodes.

In another example of the filter device the additional circuit includes an acoustic absorber disposed outside the at least three IDT electrodes.

In another example of the filter device the additional circuit includes a floating electrode disposed outside the at least three IDT electrodes.

In another example the filter device further comprises at least one of a first inductor component connected between the common terminal and the additional circuit, a second inductor component connected between the first terminal and the additional circuit, and a third inductor component connected between the second terminal and the additional circuit.

In one example of the filter device at least a portion of each of the first filter, the second filter, and the additional circuit is formed on a first substrate separated from a second substrate associated with the remaining components.

According to another embodiment a filter device has a common terminal, a first terminal, and a second terminal, and comprises a first filter including a plurality of first filter elements connected in series between the common terminal and the first terminal, a second filter connected between the common terminal and the second terminal, and an additional circuit including a first interdigital transducer (IDT) electrode connected to the common terminal, a second IDT electrode connected to a node disposed between the plurality of first filter elements along a path extending between the common terminal and the first terminal, and a third IDT electrode connected to the second terminal.

According to another embodiment, a filter device has a common terminal, a first terminal, and a second terminal, and comprises a first filter including a plurality of first filter elements connected in series between the common terminal and the first terminal, a second filter connected between the common terminal and the second terminal, and an additional circuit including a first interdigital transducer (IDT) electrode connected to the common terminal, a second IDT electrode connected to a node disposed between the plurality of first filter elements along a path extending between the common terminal and the first terminal, a third IDT electrode connected to the first terminal, and a fourth IDT electrode connected to the first terminal.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Filters are widely used in many electronic devices, including wireless communications devices, such as mobile phones and the like. As discussed above, important performance metrics can include the attenuation characteristics of the filters, and isolation between different filters. Aspects and embodiments are directed to circuits that can be included in filter devices, such as duplexers or diplexers, for example, and configured to provide improved attenuation characteristics. In particular, aspects and embodiments provide an additional circuit configured as a longitudinally-coupling-type acoustic wave resonator or acoustic wave delay line that includes three or more interdigital transducer (IDT) electrodes, which can be used in combination with one or more filters in a filter device. As discussed in more detail below, the additional circuit can be connected to two or more terminals (e.g., input, output, or common terminals) and/or connection points within the one or more filters in the filter device, thereby allowing for highly flexible adjustment of characteristics of the filter device, including phase manipulation.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
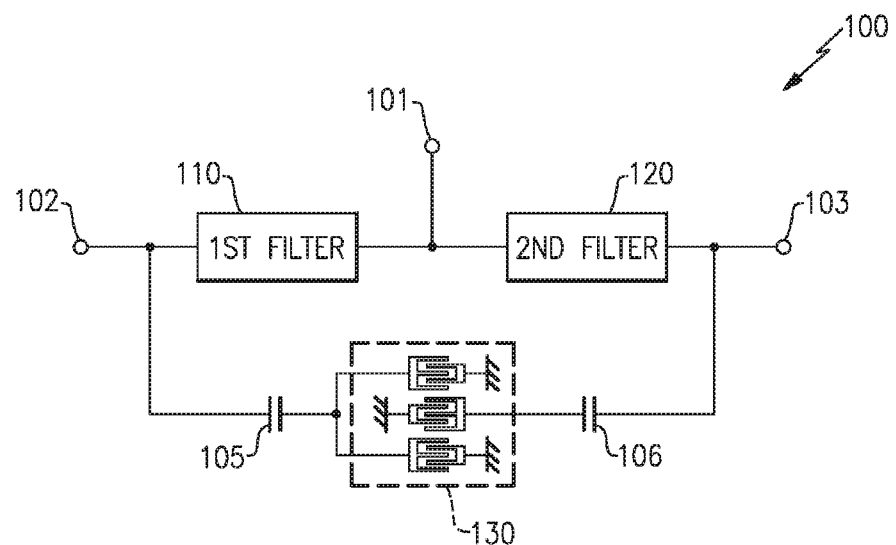
FIG. 1 is a schematic diagram illustrating an example of a conventional filter device.
Figure 2:
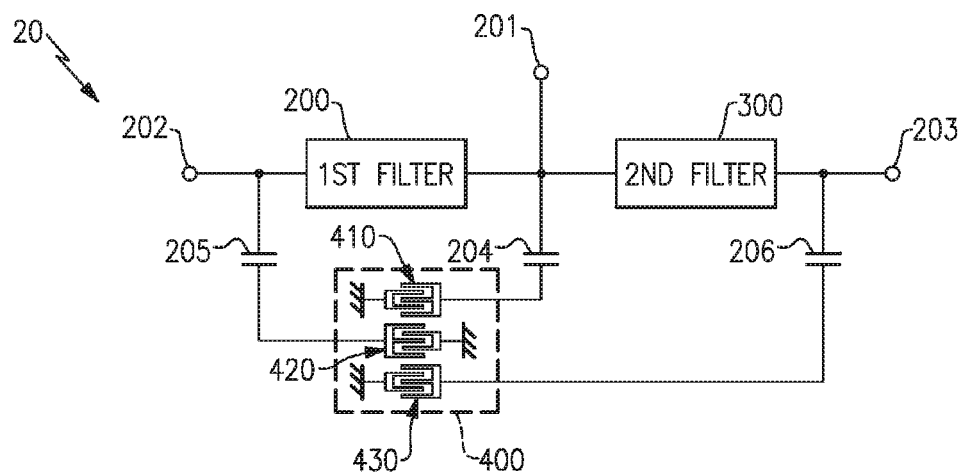
FIG. 2 is a schematic diagram illustrating an exemplary configuration of a filter device according to aspects of the present invention.

FIG. 2 is a schematic diagram illustrating one example of a filter device including an additional circuit. The filter device 20 includes a common terminal 201, a first terminal 202, and a second terminal 203. In the illustrated example, the filter device 20 further includes a first filter 200 and a second filter 300. The first filter 200 is connected between the common terminal 201 and the first terminal 202, and has a first passband. The second filter 300 is connected between the common terminal 201 and the second terminal 203, and has a second passband that does not overlap the first passband. In the example shown in FIG. 2, the additional circuit 400 is connected between the first terminal 202 and the common terminal 201; however, a variety of other connection configurations can be implemented, as discussed further below. The additional circuit 400 can be configured as a longitudinal-coupling-type acoustic wave resonator or acoustic wave delay line including a plurality of IDT electrodes. In the example shown in FIG. 2, the additional circuit 400 includes first to third IDT electrodes 410, 420, 430, which can be disposed along a propagation direction of corresponding acoustic waves. However, in other embodiments, the additional circuit 400 may include four or five IDT electrodes, as discussed further below. In the conventional filter device 100 shown in FIG. 1, the longitudinal-coupling-type acoustic wave resonator or acoustic wave delay line 130 is connected between the transmission terminal 102 and the reception terminal 103. In contrast, embodiments of the additional circuit 400 can be connected between any of the first terminal 202, the common terminal 201, the second terminal 203, a connection node inside the first filter 200, and a connection node inside the second filter 300. Accordingly, properly configuring the additional circuit 400 may allow highly flexible adjustment, including phase adjustment, because the adjustment can be enabled not only between the first terminal 202 and the second terminal 203 but also between the common terminal 201 and the first terminal 202 and between the common terminal 201 and the second terminal 203. Such phase adjustment can improve the attenuation and isolation characteristics of the filter device 20.

In the example shown in FIG. 2, the filter device 20 also includes a first capacitor 204 connected between the common terminal 201 and the additional circuit 400. A second capacitor 205 is connected between the first terminal 202 and the additional circuit 400. Further, a third capacitor 206 is connected between the second terminal 203 and the additional circuit 400. Properly configuring the first, second, and third capacitors 204, 205, 206 may optimize the capacitance of the additional circuit 400 such that the performance of the additional circuit 400 can be improved.

Further, inserting the second capacitor 205 between the first terminal 202 and the additional circuit 400 may prevent degradation in the attenuation characteristics caused by a coupling between the signal path from the first terminal 202 to the additional circuit 400 and an element disposed inside the first filter 200. Inserting the third capacitor 206 between the second terminal 203 and the additional circuit 400 may prevent degradation in the attenuation characteristics caused by a coupling between a signal path from the second terminal 203 to the additional circuit 400 and an element disposed inside the second filter 300. Inserting the first capacitor 204 between the common terminal 201 and the additional circuit 400 may prevent degradation in the attenuation characteristics caused by a coupling between a signal path from the common terminal 201 to the additional circuit 400 and elements disposed inside the first filter 200 and the second filter 300. Properly selecting the capacitance of the first capacitor 204 can favorably alter the impedance of the additional circuit 400 as "seen" from the common terminal 201, and thereby reduce the effects of signals coming from the common terminal 201 on the additional circuit 400.

In one embodiment, the second capacitor 205 may preferably be disposed physically closer to the first terminal 202 than to a midpoint of a connection wiring extending between the first terminal 202 and the additional circuit 400. Further, the third capacitor 206 may preferably be disposed physically closer to the second terminal 203 than to a midpoint of a connection wiring extending between the second terminal 203 and the additional circuit 400. In the example of the filter device 20 illustrated in FIG. 2, locating the second and third capacitors 205, 206 as presented above may reduce a signal leak associated with the capacitors. It is to be appreciated that the filter device 20 need not necessarily include all of the first, second, and third capacitors 204, 205, 206 and at least one capacitor thereof may be sufficient.

According to certain embodiments, in the additional circuit 400, polarity directions of the first and third IDT electrodes 410, 430 can be configured opposite to a polarity direction of the second IDT electrode 420, where the polarity direction can be defined as a direction from one comb-shaped electrode of an IDT electrode connected to the ground toward the other comb-shaped electrode connected to the signal line. However, other embodiments of the additional circuit 400 can be configured in another manner that is not limited to the arrangement of the polarity directions of the IDT electrodes shown in FIG. 2.

Although the additional circuit 400 is depicted in FIG. 2 to include three IDT electrodes, i.e., the first to third IDT electrodes 410, 420, 430, other embodiments of the filter device 20 are not so limited, and the additional circuit 400 may include three or more IDT electrodes that may constitute a longitudinal-coupling-type acoustic wave resonator or an acoustic wave delay line. Further, the polarity directions of the three or more IDT electrodes 410, 420, 430 can be arbitrarily configured.

FIGS. 3A to 3E are schematic diagrams illustrating various configurations of examples of the additional circuit 400.

Figure 3A:
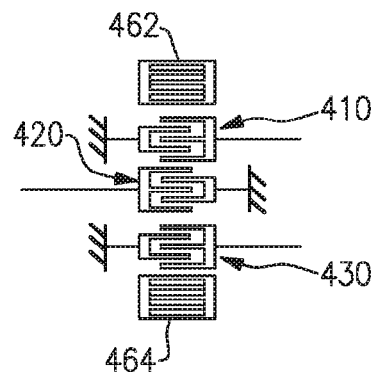
FIGS. 3A-E are schematic diagrams illustrating configurations of examples of an additional circuit forming part of the filter device according to aspects of the present invention.

In one embodiment, reflectors 462, 464 can be formed at opposite ends along an acoustic wave propagation direction within the additional circuit 400 including the first to third IDT electrodes 410, 420, 430. Thus, as shown in FIG. 3A, a first reflector 462 can be formed in parallel with the first IDT electrode 410, while a second reflector 464 can be formed in parallel with the third IDT electrode 430. The first and second reflectors 462, 464 can reflect acoustic waves coming from the first to third IDT electrodes 410, 420, 430 formed between the first and second reflectors 462, 464 back to the first to third IDT electrodes 410, 420, 430. Accordingly, the first and second reflectors 462, 464 may prevent an acoustic coupling between the additional circuit 400 and its external peripheral circuitry.

Figure 3B:
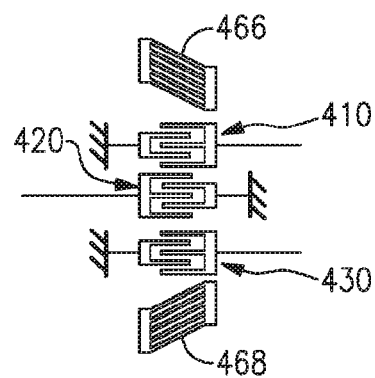

As shown in FIG. 3B, in other examples, the reflectors can be formed oblique with respect to polarity directions of the first to third IDT electrodes 410, 420, 430. Thus, a first oblique reflector 466 disposed adjacent to the first IDT electrode 410 can be formed at a certain angle with the first IDT electrode 410, while a second oblique reflector 468 disposed adjacent to the third IDT electrode 430 can be formed at a certain angle with the third IDT electrode 430.

In certain examples, the angle between the first IDT electrode 410 and the first oblique reflector 466 can be an angle between a direction determined by the polarity direction of the first IDT electrode 410 and a direction in which a group of electrodes included in the first oblique reflector 466 extends. The same may apply to the relationship between the third IDT electrode 430 and the second oblique reflector 468. The certain angle can be set, for example, between 30 to 60 degrees. Also, the first and second oblique reflectors 466, 468 can be arranged symmetric or antisymmetric with respect to the first to third IDT electrodes 410, 420, 430 (although only the antisymmetric arrangement is shown in FIG. 3B).

The first and second oblique reflectors 466, 468 can reflect acoustic waves coming from the first to third IDT electrodes 410, 420, 430 formed between the first and second oblique reflectors 466, 468, so that the reflected acoustic waves can be prevented from being directed back to the first to third IDT electrodes 410, 420, 430. Accordingly, the first and second oblique reflectors 466, 468 may prevent an acoustic coupling between the additional circuit 400 and its external peripheral circuitry and also prevent an interference caused by acoustic waves reflected back to the first to third IDT electrodes 410, 420, 430.

Figure 3C:
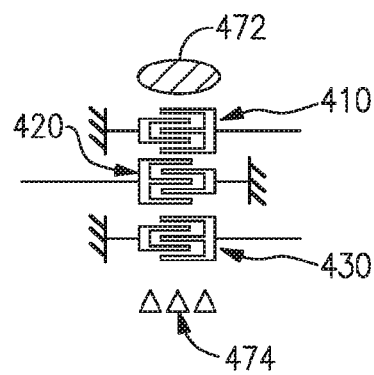

As shown in FIG. 3C, an acoustic absorber 472 can be formed instead of the first reflector 462. The acoustic absorber 472 may include a resin having a property for attenuating an incoming acoustic wave. Further, a floating electrode 474 can be formed instead of the second reflector 464. The floating electrode 474 can scatter acoustic waves coming from the first to third IDT electrodes 410, 420, 430 by an electrode pattern having one or more triangle shaped elements. It is to be appreciated that, although the acoustic absorber 472 or the floating electrode 474 is depicted only as one-sided arrangement with respect to the first to third IDT electrodes 410, 420, 430, a two-sided arrangement can be configured with respect to the first to third IDT electrodes 410, 420, 430, such that two acoustic absorbers 472 are used or alternatively, two floating electrodes 474 (not shown).

The acoustic absorber 472 and the floating electrode 474 may absorb and scatter the acoustic waves coming from the first to third IDT electrodes 410, 420, 430 such that an acoustic coupling between the additional circuit 400 and its peripheral circuitry can be prevented and also an interference caused by acoustic waves reflected back to the first to third IDT electrodes 410, 420, 430 can be prevented.

Figure 3D:
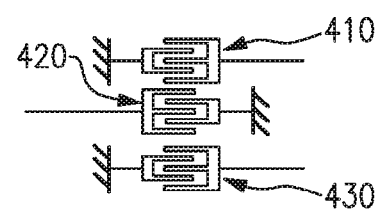

As shown in FIG. 3D, a metallization ratio η of the first to third IDT electrodes 410, 420, 430 included in the additional circuit 400 can be changed. Further, a film thickness of the first to third IDT electrodes 410, 420, 430 can be changed. Changing the metallization ratio η and/or the film thickness can lead to a property adjustment such as a phase manipulation of the additional circuit 400.

Figure 3E:
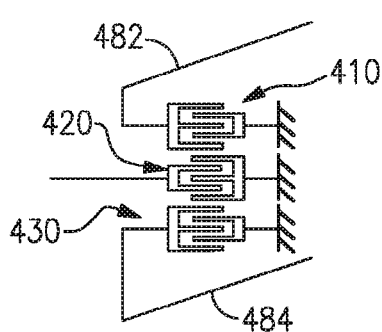

As shown in FIG. 3E, respective wirings 482, 484 drawn from the first and third IDT electrodes 410, 430 can be routed to extend outward from the first and third IDT electrodes 410, 430 and obliquely at certain angles with a direction determined by the polarity directions of the first and third IDT electrodes 410, 430. A direction in which each of the wirings 482, 484 extends may form a certain angle ranging from 30 to 60 degrees with respect to the first and third IDT electrodes 410, 430. Further, wirings 482, 484 drawn from and opposed respectively to the first and third IDT electrodes 410, 430 can be arranged symmetric (as shown) or antisymmetric with respect to the first to third IDT electrodes 410, 420, 430.

The obliquely extending wirings 482, 484 opposed respectively to the first and third IDT electrodes 410, 430 can reflect acoustic waves coming from the first to third IDT electrodes 410, 420, 430 in the direction oblique to a propagation direction of the acoustic waves within the additional circuit 400 such that an acoustic coupling between the additional circuit 400 and its peripheral circuitry can be prevented and also an interference caused by acoustic waves reflected back to the first to third IDT electrodes 410, 420, 430 can be prevented.

The first filter 200 and the second filter 300 in the filter device 20 may be formed by ladder-type filters or longitudinal-coupling-type filters. Further, these filters may be formed by surface acoustic wave elements or film bulk acoustic resonators (FBARs). For example, one of the first filter 200 and the second filter 300 may be formed by one or more surface acoustic wave elements, whereas the other may be formed by one or more FBARs.

In certain examples the first filter 200, the second filter 300, and the additional circuit 400 can be formed commonly on a single substrate; however, in other examples, at least one thereof can be formed on a separate substrate. Further, any one of the first filter 200, the second filter 300, and the additional circuit 400 can be partially formed on a substrate that is separated from the substrate on which the remaining one(s) may be formed.

Although examples of the filter device 20 can be used for an application having a frequency band of several hundred MHz, the application is not limited to have such a frequency band. In certain examples, lithium niobate or lithium tantalate can be used for a substrate on which surface acoustic wave resonator(s) of the first filter 200 and the second filter 300 are formed, and for a substrate on which a surface acoustic wave resonator or acoustic wave delay line in the additional circuit 400 is formed; however, in other examples, another material can be used therefor. Further, although silicon can be used for the first filter 200 and the second filter 300 using FBARs, another material can be used therefor.

According to certain embodiments, the filter device 20 can be configured as a duplexer that can separate transmission and reception signals. An example of a duplexer 30 incorporating an embodiment of the filter device 20 is shown schematically in FIG. 4A. In this example, the common terminal 201 can be used as an antenna terminal 201a that can be coupled to an antenna 710, the first terminal 202 can be used as a transmission terminal 202a that can be coupled to transmission circuitry 32, and the second terminal 203 can be used as a reception terminal 203a that can be coupled to reception circuitry 34. Further, the first filter 200 can be used as a transmission filter 200a, and the second filter 300 can be used as a reception filter 300a.

In such an example, properly configuring the longitudinal-coupling-type acoustic wave resonator or acoustic wave delay line including at least three IDT electrodes 410, 420, 430 in the additional circuit 400 may allow highly flexible phase manipulation among the antenna terminal 201a, the transmission terminal 202a, and the reception terminal 203a. Accordingly, the attenuation characteristics of the transmission filter 200a and the reception filter 300a and the isolation characteristics of the duplexer 30 can be improved. For example, a second passband of the reception filter 300a may correspond to a suppression band for the transmission filter 200a. The additional circuit 400 can generate a signal having a reversed phase in the suppression band with respect to a signal transferred via the transmission filter 200a. Such a reversed phase signal may cancel out the signal transferred via the transmission filter 200a in the suppression band and therefore the transmission filter 200a can be improved in its attenuation characteristics. Further, the additional circuit 400 can generate a signal having a reversed phase in the suppression band with respect to a signal transferred via the transmission filter 200a and the reception filter 300a. Such a reversed phase signal may cancel out the signal via the transmission filter 200a and the reception filter 300a in the suppression band and therefore the duplexer 30 can be improved in its isolation characteristics.

According to another embodiment, the filter device 20 can be configured as a diplexer separating reception signals having two frequency bands. An example of a diplexer 40 incorporating an embodiment of the filter device 20 is shown schematically in FIG. 4B. In this example, the common terminal 201 can be used as an antenna terminal 201b that can be connected to an antenna 710, the first terminal 202 can be used as a first reception terminal 202b, and the second terminal 203 can be used as a second reception terminal 203b. Further, the first filter 200 can be used as a first reception filter 200b and the second filter 300 can be used as a second reception filter 300b. In such an example, properly configuring the longitudinal-coupling-type acoustic wave resonator or acoustic wave delay line including at least three IDT electrodes 410, 420, 430 in the additional circuit 400 may allow highly flexible phase manipulation among the antenna terminal 201b, the first reception terminal 202b, and the second reception terminal 203b. Accordingly, the first reception filter 200b and the second reception filter 300b can be improved in their attenuation characteristics.

FIGS. 5A to 5D are graphs illustrating simulation results of frequency characteristics for an example of the filter device 20 included in a duplexer 30. The simulation assumes using ladder-type filters applied to both of the first and second filters 200, 300. The comparative example represents a conventional filter device configured as shown in FIG. 2 except that no additional circuit 400 is included.

Figure 4A:
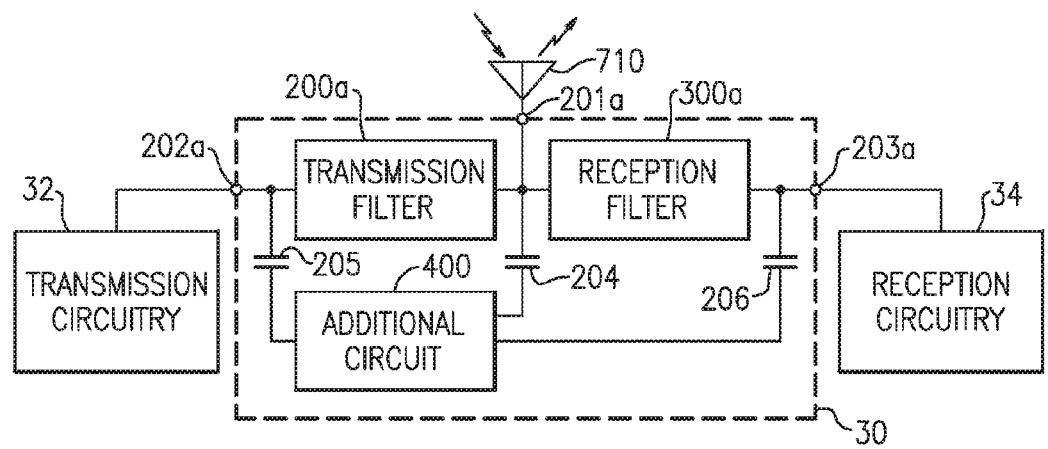
FIG. 4A is a schematic diagram illustrating one example of an antenna duplexer including an example of the filter device of FIG. 2 according to aspects of the present invention.
Figure 4B:
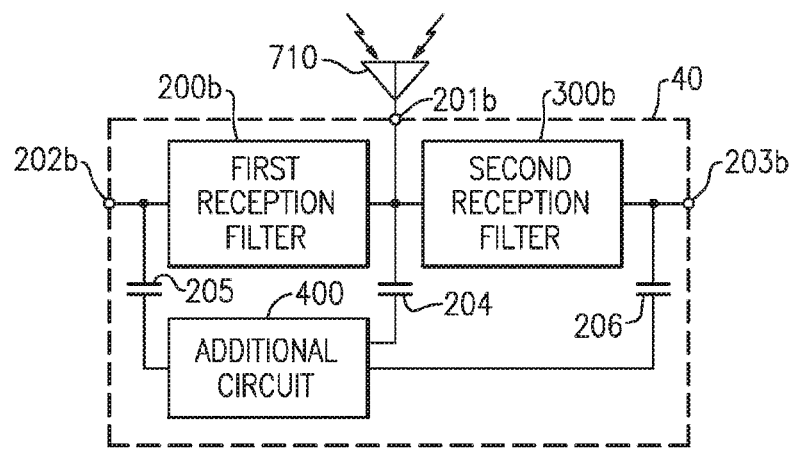
FIG. 4B is a schematic diagram illustrating one example of a diplexer including an example of the filter device of FIG. 2 according to aspects of the present invention.
Figure 5A:
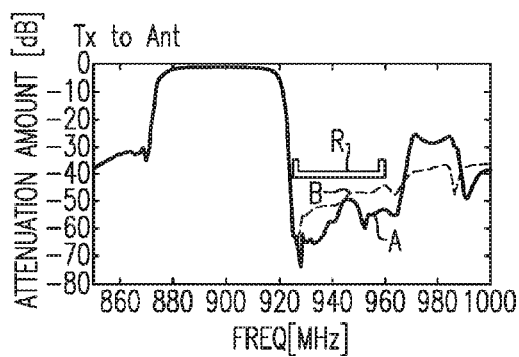
FIGS. 5A-D are graphs illustrating simulated frequency characteristics of an example of the filter device according to aspects of the present invention and a comparative example of a filter device.
Figure 5B:
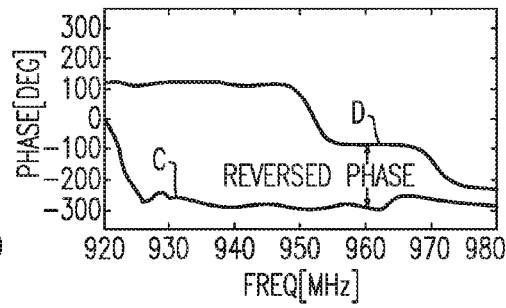

As described above, in certain applications the filter device 20 according to various embodiments can be used as duplexer, as shown in FIG. 4A, for example. FIG. 5A shows frequency characteristics of an attenuation amount in a signal transmitted from the first terminal 202 as a transmission terminal (Tx) 202a to the common terminal 201 as an antenna terminal (Ant) 201a through the first filter 200 as transmission filter 200a within the duplexer 30. The frequency response of the example of the filter device 20 is represented by a solid line A, whereas the comparative example is represented by a dashed line B. FIG. 5B shows a phase profile C of a signal passing through the transmission filter 202a and a phase profile D of a signal generated by the additional circuit 400 connected between the transmission 202a and the antenna terminal 201a respectively.

As seen in FIG. 5A, the curve A representing the example of the filter device 20 indicates lowered gains across the suppression band R of the transmission filter 200a with respect to the curve B of the comparative example. Further, according to FIG. 5B, the signal passing through the transmission filter 200a represented by the curve C can be regarded as having substantially reversed phase relative to the signal generated by the additional circuit 400 represented by the curve D across the suppression band R (approximately 930 MHz to 960 MHz as shown). Thus, in the example of the filter device 20, the signal passing through the transmission filter 202a can be cancelled out by the reversed phase signal generated by the additional circuit 400 across the suppression band R. Accordingly, the signal transmitted from the transmission terminal 202a to the antenna terminal 201a can be suppressed such that the attenuation characteristics of the first filter 200 can be improved.

Figure 5C:
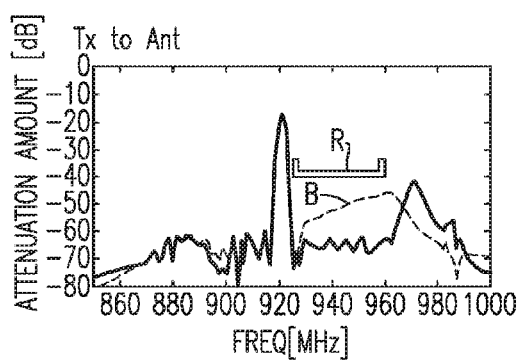
Figure 5D:
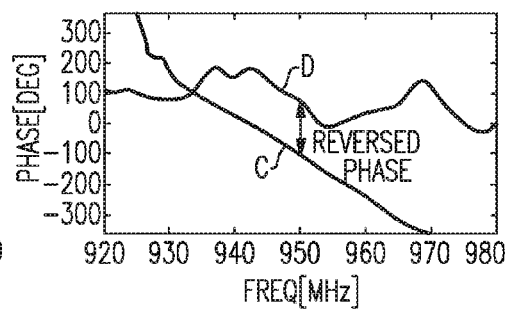

FIG. 5C shows frequency characteristics of an attenuation amount in a signal transmitted from the first terminal 202 as the transmission terminal (Tx) 202a to the second terminal 203 as the reception terminal (Rx) 203a through the first filter 200 as the transmission filter 200a and the second filter 300 as the reception filter 300a within the duplexer 30. The frequency characteristic of the example of the filter device 20 is represented by a solid line A, whereas the comparative example is represented by a dashed line B. FIG. 5D shows a phase profile C of a signal passing through the first or transmission filter 200a and the second or reception filter 300a and a phase profile D of a signal generated by additional circuit 400 between the first or transmission terminal 202a and the second or reception terminal 203a respectively.

As seen in FIG. 5C, the curve A representing the example of the filter device 20 indicates significantly lowered gains across the suppression band R of the first or transmission filter 200a with respect to the curve B of the comparative example. Further, according to FIG. 5D, the signal passing through the first or transmission filter 200a and the second or reception filter 300a represented by the curve C can be regarded as having substantially reversed phase relative to the signal generated by the additional circuit 400 represented by the curve D across the suppression band R. Thus, in the example of the filter device 20, the signal passing through the transmission filter 200a and the reception filter 300a can be cancelled out by the reversed phase signal generated by the additional circuit 400 across the suppression band R. Accordingly, the signal transmitted from the transmission terminal 202a to the reception terminal 203a can be suppressed such that the isolation characteristics of the duplexer 30 can be improved.

The filter device 20 can be implemented using any of a variety of configurations, some examples of which are discussed further below.

Figure 6:
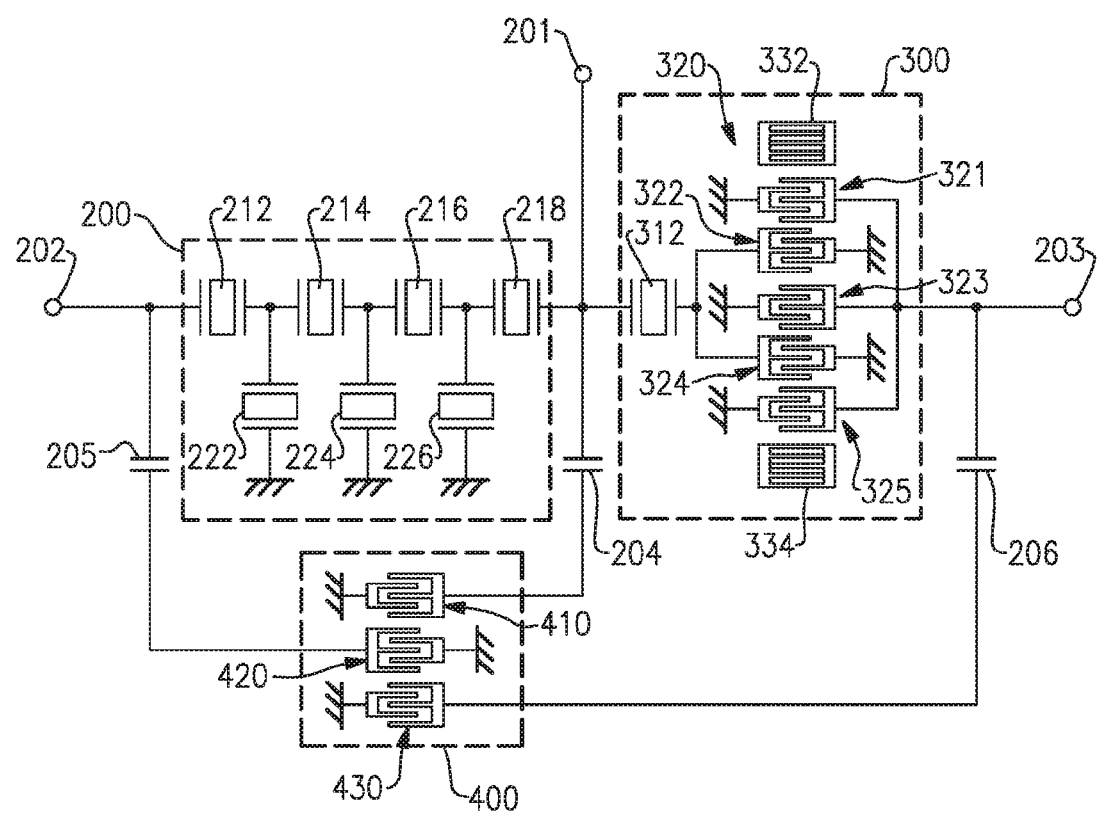
FIG. 6 is a schematic diagram illustrating one example of the filter device of FIG. 2 according to aspects of the present invention.

FIG. 6 is a schematic diagram illustrating a first embodiment of the filter device 20. The first embodiment of the filter device 20 is one specific example of a filter device according to the basic configuration of the filter device as shown in FIG. 2. Additional embodiments are similarly described below.

As shown in FIG. 6, according to one embodiment, the filter device 20 includes the first filter 200 connected between the common terminal 201 and the first terminal 202 and the second filter 300 connected between the common terminal 201 and the second terminal 203. Further, the additional circuit 400 is connected between the common terminal 201 and the first terminal 202 and between the common terminal 201 and the second terminal 203.

In the embodiment shown in FIG. 6, the first filter 200 is formed by ladder-type resonators. The first filter 200 may include first to fourth resonators 212, 214, 216, 218, which are connected in series along a path extending from the first terminal 202 to the common terminal 201. The first filter 200 may further include fifth to seventh resonators 222, 224, 226, which are connected in parallel between the path extending from the first terminal 202 to the common terminal 201 and a ground or reference potential. Respective resonators 212, 214, 216, 218, 222, 224, and 226 can be formed by surface acoustic wave resonators or can be formed by thin film resonators.

In the embodiment shown in FIG. 6, the second filter 300 includes an eighth resonator 312 and a longitudinal-coupling-type filter 320, which are connected in series along a path extending from the common terminal 201 to the second terminal 203. The eighth resonator 312 can be formed as a surface acoustic wave resonator or a thin film resonator. The longitudinal-coupling-type filter 320 can be formed by surface acoustic wave elements and may include first to fifth IDT electrodes 321, 322, 323, 324, and 325 that are formed on a substrate sequentially along a propagation direction of acoustic waves.

In the longitudinal-coupling-type filter 320, the first IDT electrode 321, the third IDT electrode 323, and the fifth IDT electrode 325 can be connected to the second terminal 203. The second IDT electrode 322 and the fourth IDT electrode 324 electrode can be connected to the eighth resonator 312. As discussed above, the polarity direction of each of the first IDT electrode 321, the third IDT electrode 323, and the fifth IDT electrode 325 can be configured opposite to the polarity direction of each of the second IDT electrode 322 and the fourth IDT electrode 324, where the polarity direction can be defined as a direction from one comb-shaped electrode of an IDT electrode connected to the ground toward the other comb-shaped electrode connected to the signal line.

In the longitudinal-coupling-type filter 320, reflectors are formed at opposing ends along the propagation direction of acoustic waves. Thus, a first reflector 332 can be formed in parallel with and to the outside of the first IDT electrode 321, while a second reflector 334 can be formed in parallel with and to the outside of the fifth IDT electrode 325, as shown in FIG. 6, for example.

The additional circuit 400 can be configured as a longitudinal-coupling-type acoustic wave resonator or acoustic wave delay line in which first to third IDT electrodes 410, 420, 430 are formed sequentially along the propagation direction of acoustic waves on the substrate. Each of the first to third IDT electrodes 410, 420, 430 can be configured as having a shape, a metallization ratio i.e., a ratio of a width of electrode fingers to a total of the width of electrode fingers and a width of spaces therebetween, and a film thickness, each of which is similar to that of each IDT electrode included in the longitudinal-coupling-type filter 320 of the second filter 300.

In the additional circuit 400, the polarity directions of the first and third IDT electrodes 410, 430 can be configured opposite to the polarity direction of the second IDT electrode 420, which is physically disposed between the first and third IDT electrodes 410, 430. Each IDT electrode of the additional circuit 400 can be formed on an identical substrate on which each IDT electrode constituting the longitudinal-coupling-type filter 320 of the second filter 300 is formed such that the polarity direction of each IDT electrode of the longitudinal-coupling-type filter 320 can be configured to be the same as that of each IDT electrode of the additional circuit 400.

As described above with reference to FIG. 2, the first capacitor 204 can be connected between the common terminal 201 and the additional circuit 400, the second capacitor 205 can be connected between the first terminal 202 and the additional circuit 400, and the third capacitor 206 can be connected between the second terminal 203 and the additional circuit 400.

The second capacitor 205 can be disposed physically closer to the first terminal 202 than a midpoint of a connection wiring extending between the first terminal 202 and the additional circuit 400. The third capacitor 206 can be disposed physically closer to the second terminal 203 than a midpoint of a connection wiring extending between the second terminal 203 and the additional circuit 400. Positioning the second capacitor 205 and the third capacitor 206 as presented above may reduce signal leakage associated with the second capacitor 205 and the third capacitor 206.

In the embodiment shown in FIG. 6, the first filter 200 is configured as a ladder-type filter, which can handle a signal having a greater intensity than, for example, filter 320, and therefore such embodiments of the filter device may be suitable for use as a duplexer into which a transmission signal having a relatively high intensity may be input from the first terminal 202. Further, positioning connection wirings routed to the first and third IDT electrodes 410, 430 to be opposed to a connection wiring routed to the second IDT electrode 420 may shorten the connection wirings routed from the additional circuit 400 to the common terminal 201, the first terminal 202, and the second terminal 203 respectively.

Figure 7:
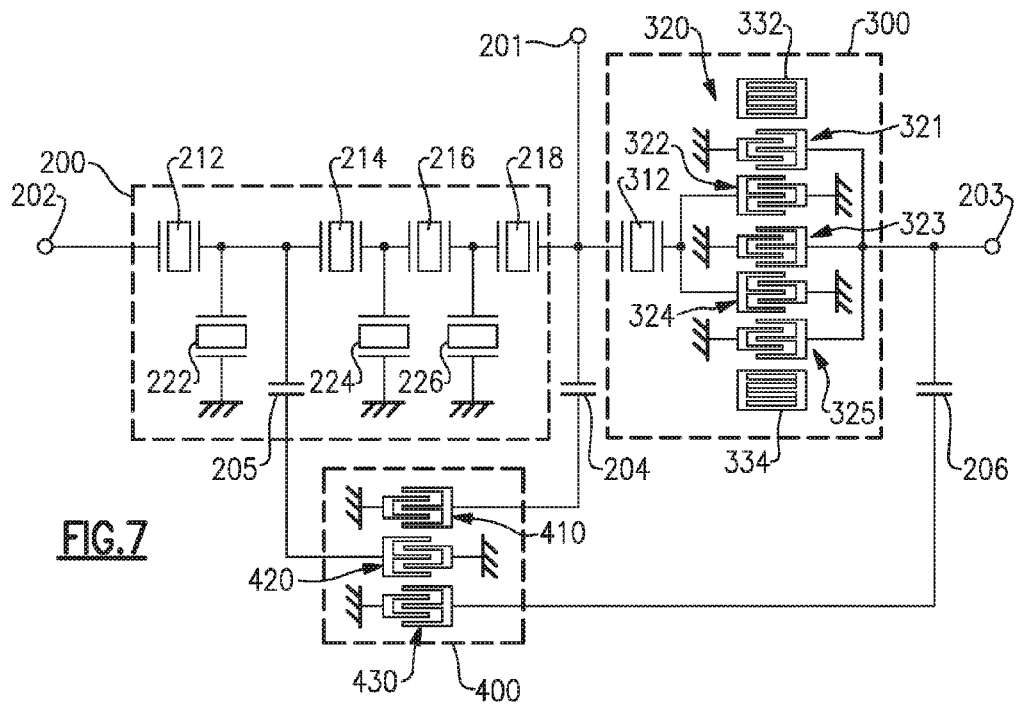
FIG. 7 is a schematic diagram illustrating another example of the filter device of FIG. 2 according to aspects of the present invention.

FIG. 7 is a schematic diagram illustrating a second embodiment of the filter device 20. The second embodiment illustrated in FIG. 7 is described below with reference to the drawings in which numerals common with the first embodiment shown in FIG. 6 indicate like elements for clarifying the correspondence relationship therebetween. Additional embodiments of the filter device 20 are similarly described below.

Referring to FIG. 7, the second embodiment is similar to the first embodiment of the filter device as shown in FIG. 6 except that the additional circuit 400 can be connected to the first terminal 202 via a single point positioned on a path connecting the first terminal 202 with the common terminal 201 inside the first filter 200. In particular, the second IDT electrode 420 of the additional circuit 400 can be connected through the second capacitor 205 to a node joining the first resonator 212 to the second resonator 214 inside the first filter 200. The other configurations are the same as those of the embodiment discussed above with reference to FIG. 6.

In the embodiment of the filter device as shown in FIG. 7, connecting the second IDT electrode 420 of the additional circuit 400 to a single point inside the first filter 200 may allow the additional circuit 400 and the first filter 200 to integrally function such that the phase manipulation of the additional circuit 400 can be performed highly flexibly to improve the attenuation and isolation characteristics.

Figure 8:
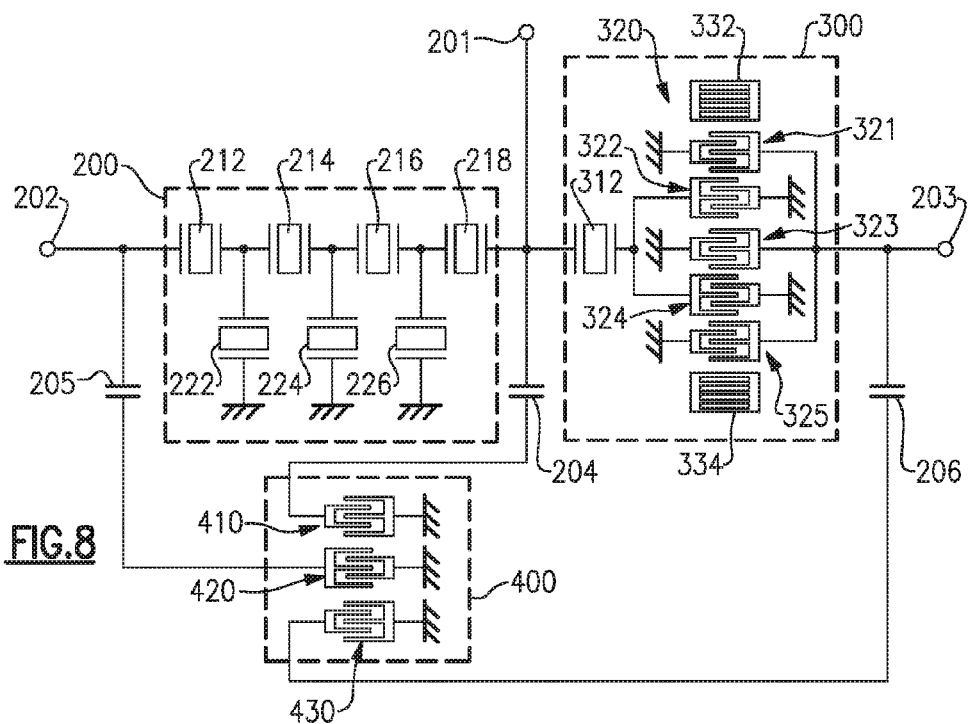
FIG. 8 is a schematic diagram illustrating another example of the filter device of FIG. 2 according to aspects of the present invention.

FIG. 8 is a schematic diagram illustrating a third embodiment of the filter device 20. The third embodiment is similar to the first embodiment of the filter device 20 as shown in FIG. 6 except that the additional circuit 400 can be configured for the first to third IDT electrodes 410, 420, 430 to be arranged to have the same polarity direction. Thus, each of the first to third IDT electrodes 410, 420, 430 can be oriented in the same polarity direction from the second terminal 203 to the first terminal 202. Accordingly, all of the grounded comb-shaped electrodes of the first to third IDT electrodes 410, 420, 430 can be disposed facing the same side toward the second terminal 203. Consequently, the grounded comb-shaped electrodes of the first to third IDT electrodes 410, 420, 430 can be joined together by connection wirings connected to a common ground terminal formed on the substrate such that the third embodiment device can be simplified in its circuit configuration.

Figure 9:
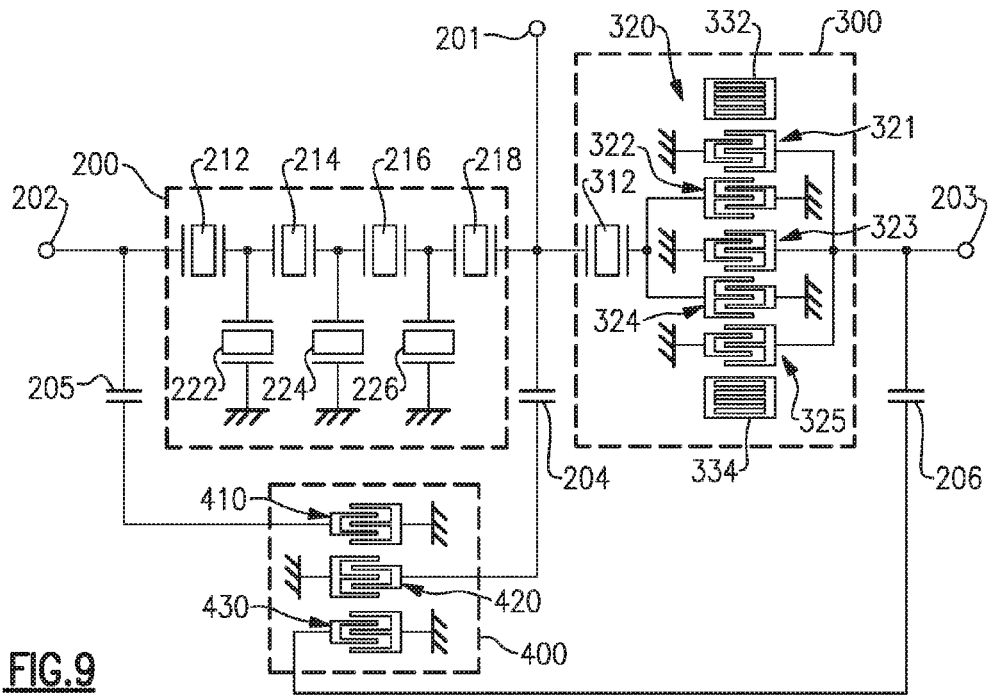
FIG. 9 is a schematic diagram illustrating another example of the filter device of FIG. 2 according to aspects of the present invention.

FIG. 9 is a schematic diagram illustrating a fourth embodiment of the filter device 20. The fourth embodiment is similar to the first embodiment of the filter device 20 as shown in FIG. 6 except for the way of connecting the first to third IDT electrodes 410, 420, 430 of the additional circuit 400 with respect to the common terminal 201, the first terminal 202 and the second terminal 203. As shown in FIG. 9, in this embodiment, the first IDT electrode 410 is connected to the first terminal 202 through the second capacitor 205, the second IDT electrode 420 is connected to the common terminal 201 through the first capacitor 204, and the third IDT electrode 430 is connected to the second terminal 203 through the third capacitor 206. Here, the first IDT electrode 410, the third IDT electrode 430, and the second IDT electrode 420 can be arranged alternately with each other in the polarity directions.

In the embodiment of the filter device 20 shown in FIG. 9, the additional circuit 400 is configured such that the second IDT electrode 420 connected to the common terminal 201 can be disposed adjacent to the first IDT electrode 410 connected to the first terminal 202, and also the second IDT electrode 420 connected to the common terminal 201 can be disposed adjacent to the third IDT electrode 430 connected to the second terminal 203. Accordingly, properly configuring a longitudinal-coupling-type acoustic wave resonator or acoustic wave delay line constituted by the IDT electrodes 410, 420, 430 may allow the phase manipulation of the resonator or delay line to be performed not only between the common terminal 201 and the first terminal 202 but also between the common terminal 201 and the second terminal 203. Accordingly, the attenuation and isolation characteristics can be improved.

Figure 10:
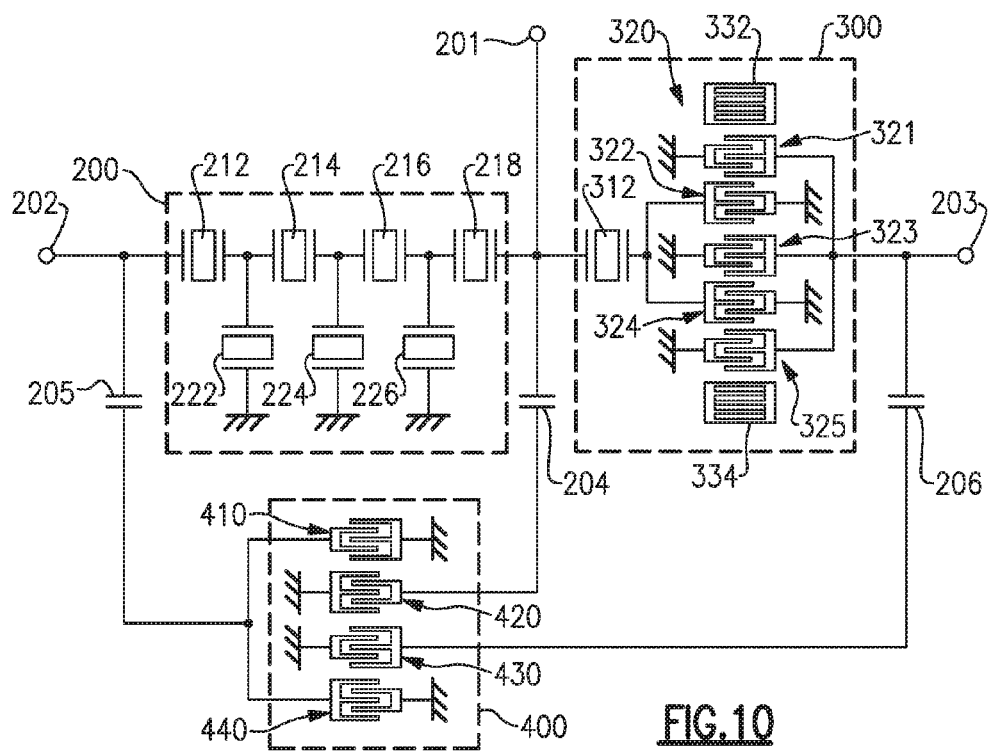
FIG. 10 is a schematic diagram illustrating another example of the filter device of FIG. 2 according to aspects of the present invention.

FIG. 10 is a schematic diagram illustrating a fifth embodiment of the filter device 20. The fifth embodiment is similar to the first embodiment of the filter device 20 as shown in FIG. 6 except that the additional circuit 400 can include four IDT electrodes, i.e., first to fourth IDT electrodes 410, 420, 430, and 440.

In particular, the first to fourth IDT electrodes 410, 420, 430, 440 can be formed sequentially in an acoustic wave propagation direction to constitute a longitudinal-coupling-type acoustic wave resonator or acoustic wave delay line. In this configuration as shown in FIG. 10, the first and fourth IDT electrodes 410, 440 can be connected to the first terminal 202 through the second capacitor 205. The second IDT electrode 420 can be connected to the common terminal 201 through the first capacitor 204. The third IDT electrode 430 can be connected to the second terminal 203 through the third capacitor 206. In certain examples the polarity directions of the first and fourth IDT electrodes 410, 440 can be configured opposed to the polarity directions of the second and third IDT electrodes 420, 430.

In the embodiment of the filter device 20 as shown in FIG. 10, the additional circuit 400 can be configured such that the second IDT electrode 420 connected to the common terminal 201 can be disposed adjacent to the first IDT electrode 410 connected to the first terminal 202, the second ID electrode 420 connected to the common terminal 201 can be disposed adjacent to the third IDT electrode 430 connected to the second terminal 203, and the fourth ID electrode 440 connected to the first terminal 202 can be disposed adjacent to the third IDT electrode 430 connected to the second terminal 203. Accordingly, properly configuring the longitudinal-coupling-type acoustic wave resonator or acoustic wave delay line constituted by the IDT electrodes 410-440 can allow the phase manipulation of the additional circuit 400 to be performed among all the terminals including the common terminal 201, the first terminal 202, and the second terminal 203 such that the attenuation and isolation characteristics can be improved.

Figure 11:
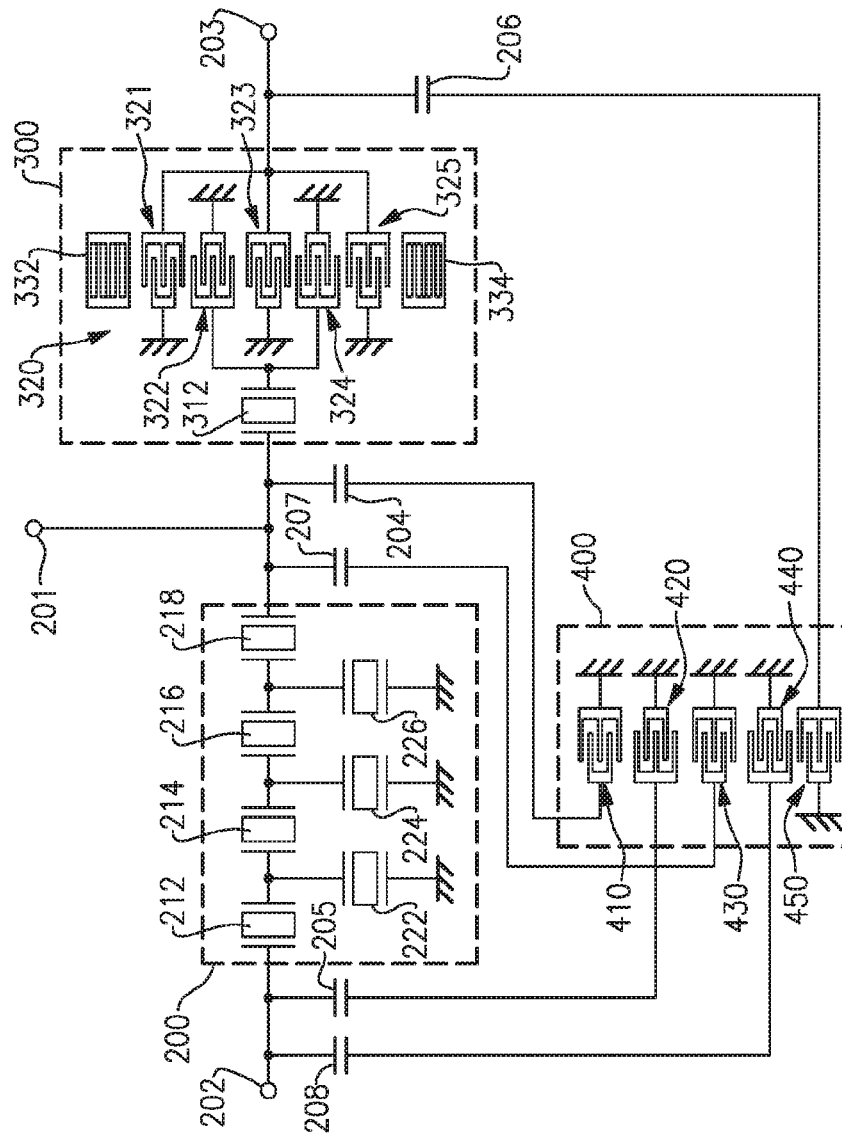
FIG. 11 is a schematic diagram illustrating another example of the filter device of FIG. 2 according to aspects of the present invention.

FIG. 11 is a schematic diagram illustrating a sixth embodiment of the filter device 20. The sixth embodiment is similar to the first embodiment of the filter device 20 as shown in FIG. 6 except that the additional circuit 400 can include five IDT electrodes, i.e., first to fifth IDT electrodes 410, 420, 430, 440, and 450. The embodiment of the filter device 20 shown in FIG. 11 is further different from the embodiment of the filter device shown in FIG. 6 and including the first to third capacitors 204, 205, 206 in that a fourth capacitor 207 can be connected between the common terminal 201 and the third IDT electrode 430 and a fifth capacitor 208 can be connected between the first terminal 202 and the fourth IDT electrode 440.

In particular, the first to fifth IDT electrodes 410, 420, 430, 440, 450 can be formed sequentially in an acoustic wave propagation direction to constitute a longitudinal-coupling-type acoustic wave resonator or acoustic wave delay line. In this configuration, as shown in FIG. 11, the first IDT electrode 410 can be connected to the common terminal 201 through the first capacitor 204, the second IDT electrode 420 can be connected to the first terminal 202 through the second capacitor 205, the third IDT electrode 430 can be connected to the common terminal 201 through the fourth capacitor 207, the fourth IDT electrode 440 can be connected to the first terminal 202 through the fifth capacitor 208, and the fifth IDT electrode 450 can be connected to the second terminal 203 through the third capacitor 206. In certain examples the polarity directions of the first to fourth IDT electrodes 410, 420, 430, 440 can be configured opposed to the polarity direction of the fifth IDT electrode 450.

In the embodiment of the filter device 20 as shown FIG. 11, the additional circuit 400 is configured such that the IDT electrodes 410-450 can be connected to the common terminal 201, the first terminal 202, or the second terminal 203 through the individual capacitors 204-208 respectively. This configuration may achieve the insertion of a signal path that can be phase manipulated between the common terminal 201 and the first terminal 202 such that properly configuring the longitudinal-coupling-type acoustic wave resonator or acoustic wave delay line constituted by the IDT electrodes 410-450 can allow the phase manipulation of the additional circuit 400 to be performed among all the terminals including the common terminal 201, the first terminal 202, and the second terminal 203 to improve the attenuation and isolation characteristics.

Further, in the embodiment of the filter device 20 as shown in FIG. 11, each of the first to fourth IDT electrodes 410, 420, 430, 440 among the IDT electrode 410-450 can be oriented in the same polarity direction from the second terminal 203 to the first terminal 202. Accordingly, the grounded comb-shaped electrodes of the first to fourth IDT electrodes 410, 420, 430, 440 can be joined together by connection wirings to a common grounded terminal formed on a substrate such that the sixth embodiment device can be simplified in its circuit configuration.

It is to be appreciated that the fourth capacitor 207 may preferably be disposed physically closer to the common terminal 201 than a midpoint of a connection wiring extending between the common terminal 201 and the additional circuit 400. Further, the fifth capacitor 208 may preferably be disposed physically closer to the first terminal 202 than a midpoint of a connection wiring extending between the first terminal 202 and the additional circuit 400. Locating the fourth and fifth capacitors 207, 208 as presented above may reduce signal leakage associated with the capacitors.

Figure 12:
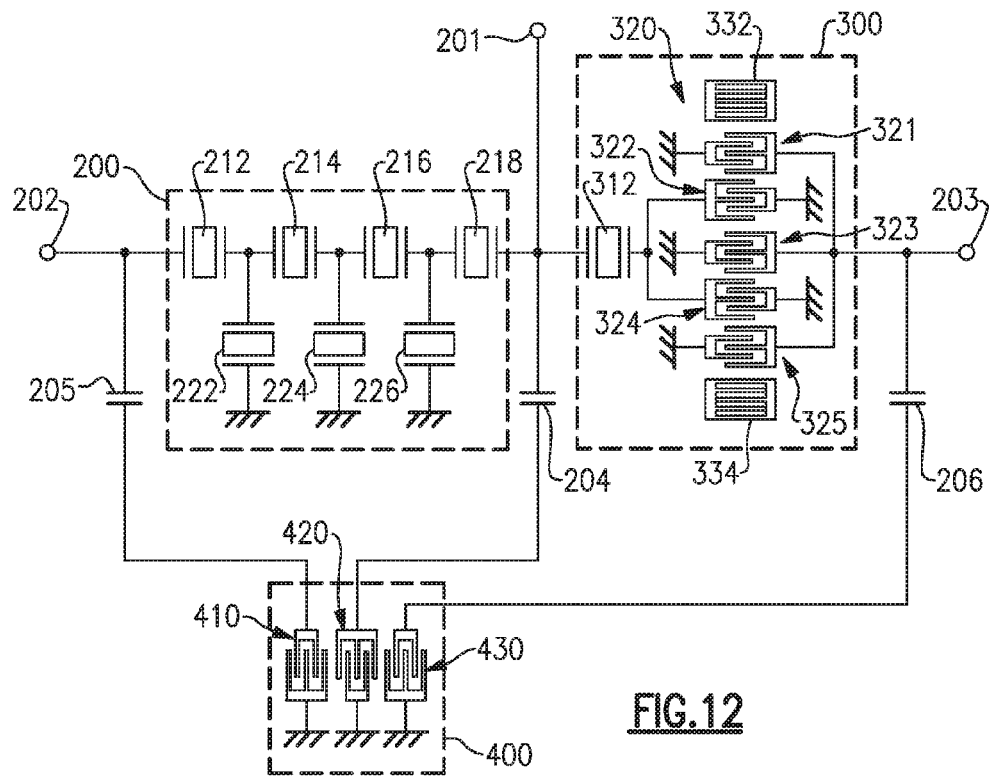
FIG. 12 is a schematic diagram illustrating another example of the filter device of FIG. 2 according to aspects of the present invention.

FIG. 12 is a schematic diagram illustrating a seventh embodiment of the filter device. The seventh embodiment is similar to the first embodiment of the filter device as shown in FIG. 6 except that the additional circuit 400 can be configured for the polarity directions of the first to third IDT electrodes 410, 420, 430 to be arranged to have a polarity direction perpendicular to respective IDT electrodes included in a longitudinal-coupling-type filter 320 of the second filter 300 formed on the same substrate as the additional circuit 400. Further, the polarity directions of the first IDT electrode 410, the second IDT electrode 420 electrode, and the third IDT electrode 430 are arranged to be the same.

Thus, the respective polarity directions of the first to third IDT electrodes 410, 420, 430 can be configured perpendicular to a direction from the fifth IDT electrode 325 to the first IDT electrode 321 disposed in the longitudinal-coupling-type filter 320 of the second filter 300. Accordingly, the first to third IDT electrodes 410, 420, 430 can be configured for all of their grounded comb-shaped electrodes to face the same side such that the comb-shaped electrodes facing the same side can be joined together by connection wirings connected to a common grounded terminal formed on the substrate.

Figure 13:
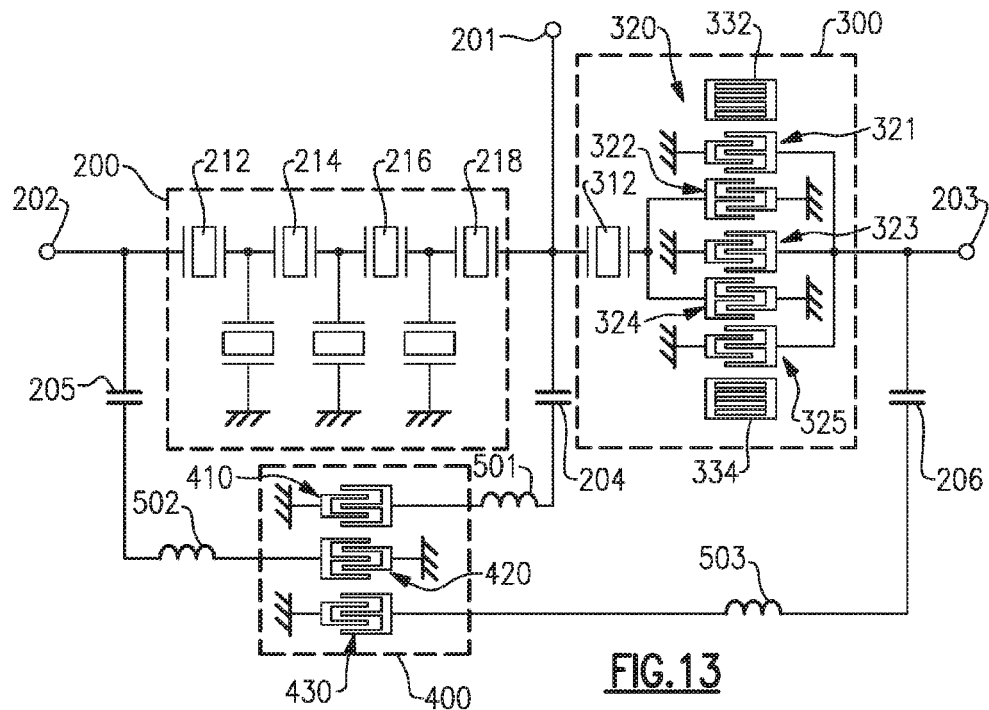
FIG. 13 is a schematic diagram illustrating another example of the filter device of FIG. 2 according to aspects of the present invention.

FIG. 13 is a schematic diagram illustrating an eighth embodiment of the filter device 20. The eighth embodiment is similar to the first embodiment of the filter device 20 as shown in FIG. 6 except that the additional circuit 400 can be configured for the first IDT electrode 410 to be connected to the first capacitor 204 through a first inductor component 501, for the second IDT electrode 420 to be connected to the second capacitor 205 through a second inductor component 502, and for the third IDT electrode 430 to be connected to the third capacitor 206 through a third inductor component 503.

The embodiment of the filter device 20 shown in FIG. 13 can allow a harmonic suppression to be performed by each of the first to third inductor components 501, 502, 503 connected to the additional circuit 400. Accordingly, an attenuation amount in the harmonic wave region can be suppressed such that the attenuation and isolation characteristics can be improved. It is to be appreciated that not all the first to third inductor components 501, 502, 503 are necessary and at least one thereof can be sufficient.

Figure 14:
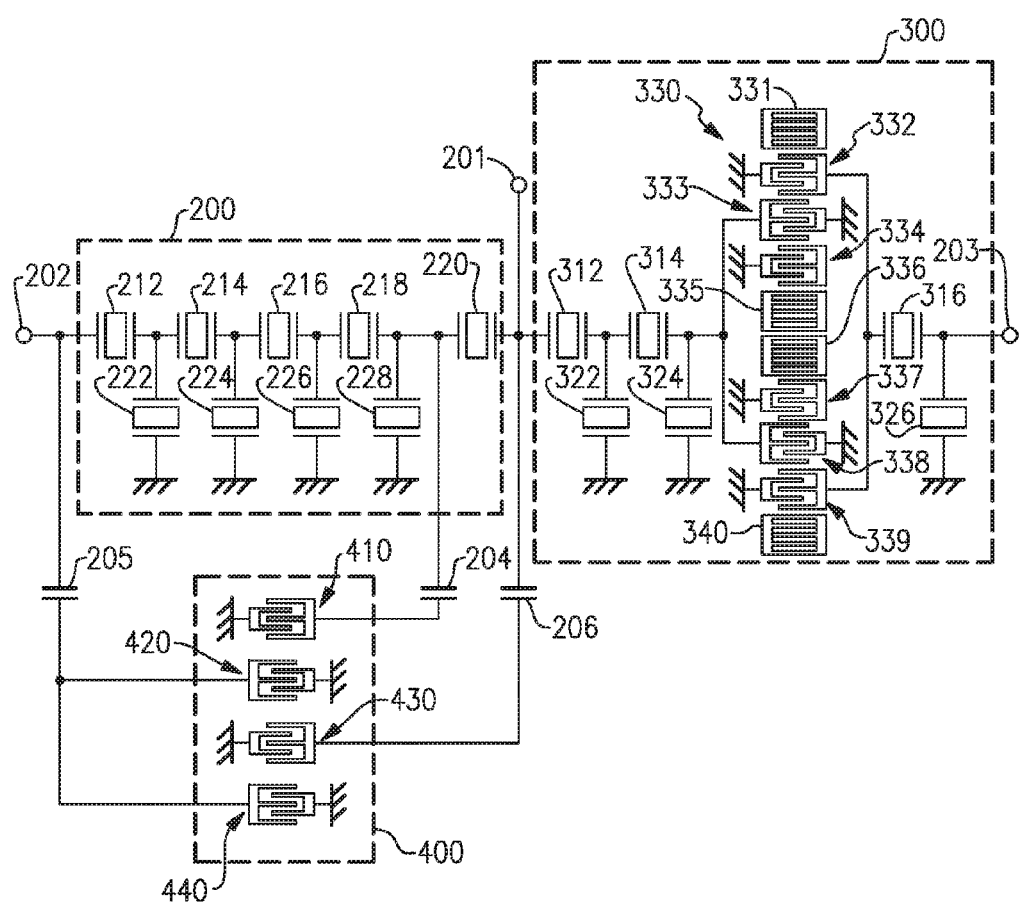
FIG. 14 is a schematic diagram illustrating another embodiment of the filter device of FIG. 2 according to aspects of the present invention.

FIG. 14 is a schematic diagram illustrating a ninth embodiment of the filter device 20. The ninth embodiment of FIG. 14 is similar to the first embodiment of the filter device 20 as shown in FIG. 6, except that the additional circuit 400 is not connected between the common terminal 201 and both of the first and second terminals 202, 203. The additional circuit 400 of the ninth embodiment includes a first IDT electrode 410 connected to a node joining fourth, fifth and ninth resonators 218, 220, 228 in the first filter 200, second and fourth IDT electrodes 420, 440 both connected to the first terminal 202, and a third IDT electrode 430 connected to the common electrode 201. Further, the number of resonators included in the first and second filters 200, 300 is different between the ninth embodiment and the first embodiment, and the number of the IDT electrodes included in the longitudinal-coupling-type filter 330 and the reflectors included in the second filter 300 is also different therebetween.

In particular, the filter device 20 includes the first filter 200 connected between the common terminal 201 and the first terminal 202 as well as the second filter 300 connected between the common terminal 201 and the second terminal 203. Further, the additional circuit 400 is connected to at least three terminal(s) and/or node(s) of the common terminal 201, terminals including the first and second terminals 202, 203, and at least one node joining elements along a path extending between the first terminal 202 and the second terminal 203.

The first filter 200 is formed by ladder-type resonators. The first filter 200 may include first to fifth resonators 212, 214, 216, 218, 220, which are connected in series along a path extending from the first terminal 202 to the common terminal 201. The first filter 200 may further include sixth to ninth resonators 222, 224, 226, 228, which are connected in parallel between the path extending from the first terminal 202 to the common terminal 201 and the ground or reference potential. Each of the resonators 212, 214, 216, 218, 220, 222, 224, 226 and 228 may be formed by a surface acoustic wave resonator or thin film resonator.

The second filter 300 may include tenth and eleventh resonators 312, 314, a longitudinal-coupling-type filter 330, and a twelfth resonator 316 connected in series along a path extending from the common terminal 201 to the second terminal 203. The second filter 300 may further include thirteenth to fifteenth resonators 322, 324, 326, which are connected in parallel between the path extending from the common terminal 201 to the second terminal 203 and the ground or reference potential. The tenth to twelfth resonators 312, 314, 316 and the respective thirteenth to fifteenth resonators 322, 324, 326 constitute ladder-type resonators. Each of the resonators 312, 314, 316, 322, 324 and 326 may be formed by a surface acoustic wave resonator or thin film resonator.

In the longitudinal-coupling-type filter 330 formed by surface acoustic wave elements, first, second and third IDT electrodes 332, 333, 334, which are sandwiched between a first reflector 331 and a second reflector 335, are disposed along a propagation direction of acoustic waves on the substrate. Further, following the first, second and third IDT electrodes 332, 333, 334 in the propagation direction of acoustic waves, fourth, fifth and sixth IDT electrodes 337, 338, 339 are disposed and sandwiched by a third reflector 336 and a fourth reflector 340.

In the longitudinal-coupling-type filter 330, the second and seventh IDT electrodes 333, 338 may be connected to the eleventh and fourteenth resonators 314, 324. The first and sixth IDT electrodes 332, 339 may be connected to the twelfth resonator 316. Each of the third and fourth IDT electrodes 334, 337 may be a dummy electrode that is not connected to any signal line. The polarity directions of the second and fifth IDT electrodes 333, 338 may be configured opposed to the polarity directions of the first, third, fourth and sixth IDT electrodes 332, 334, 337, 339. Here, the polarity direction can be defined as a direction from one comb-shaped electrode of an IDT electrode connected to the ground toward the other comb-shaped electrode connected to a signal line.

The additional circuit 400 may be configured as a longitudinal-coupling-type acoustic wave resonator or an acoustic wave delay line, in which first to fourth IDT electrodes 410, 420, 430, 440 are sequentially formed on the substrate in a propagation direction of acoustic waves. In certain examples, each of the first to fourth IDT electrodes 410, 420, 430, 440 has a pitch of the IDT electrode fingers, which is 1/1.2 to 1/1.3 as the pitch of the IDT electrode fingers of a resonator included in the first filter 200. Configuring the pitch of the IDT electrode fingers of the additional circuit 400 in this manner can suppress a higher-order mode that may occur at a frequency 1.2 to 1.3 times greater than the center frequency of the main mode of the first filter 200 and thus can improve the attenuation characteristics.

In the additional circuit 400, the polarity directions of the first and third IDT electrodes 410, 430 can be configured opposite to the polarity directions of the second and fourth IDT electrodes 430, 440. Each IDT electrode of the additional circuit 400 can be formed on the same substrate as each IDT electrode constituting the longitudinal-coupling-type filter 330 of the second filter 300 such that the polarity direction of each IDT electrode of the longitudinal-coupling-type filter 330 can be configured as parallel to that of each IDT electrode of the additional circuit 400.

In the ninth embodiment shown in FIG. 14, when the additional circuit 400 is connected to the common terminal 201, the first terminal 202, and at least one node included in the first filter 200, configuring the pitch of the IDT electrode fingers included in the additional circuit 400 as 1/1.2 to 1/1.3 as the pitch of the IDT electrode fingers included in the first filter 200 may suppress a higher-order mode that may occur in the frequency band 1.2 to 1.3 times greater than the center frequency of the main mode of the first filter 200, and thus may improve the attenuation characteristics of the filter device. Such a higher-order mode tends to occur in a temperature-compensation-type surface acoustic wave element (TC-SAW) and accordingly the ninth embodiment may be suitable for use where the first filter or filter device 20 uses a TC-SAW. Further, isolation from the frequency band for the carrier aggregation (CA), which corresponds to a frequency band 1.2 to 1.3 times greater than the main mode, can be ensured.

Figure 15:
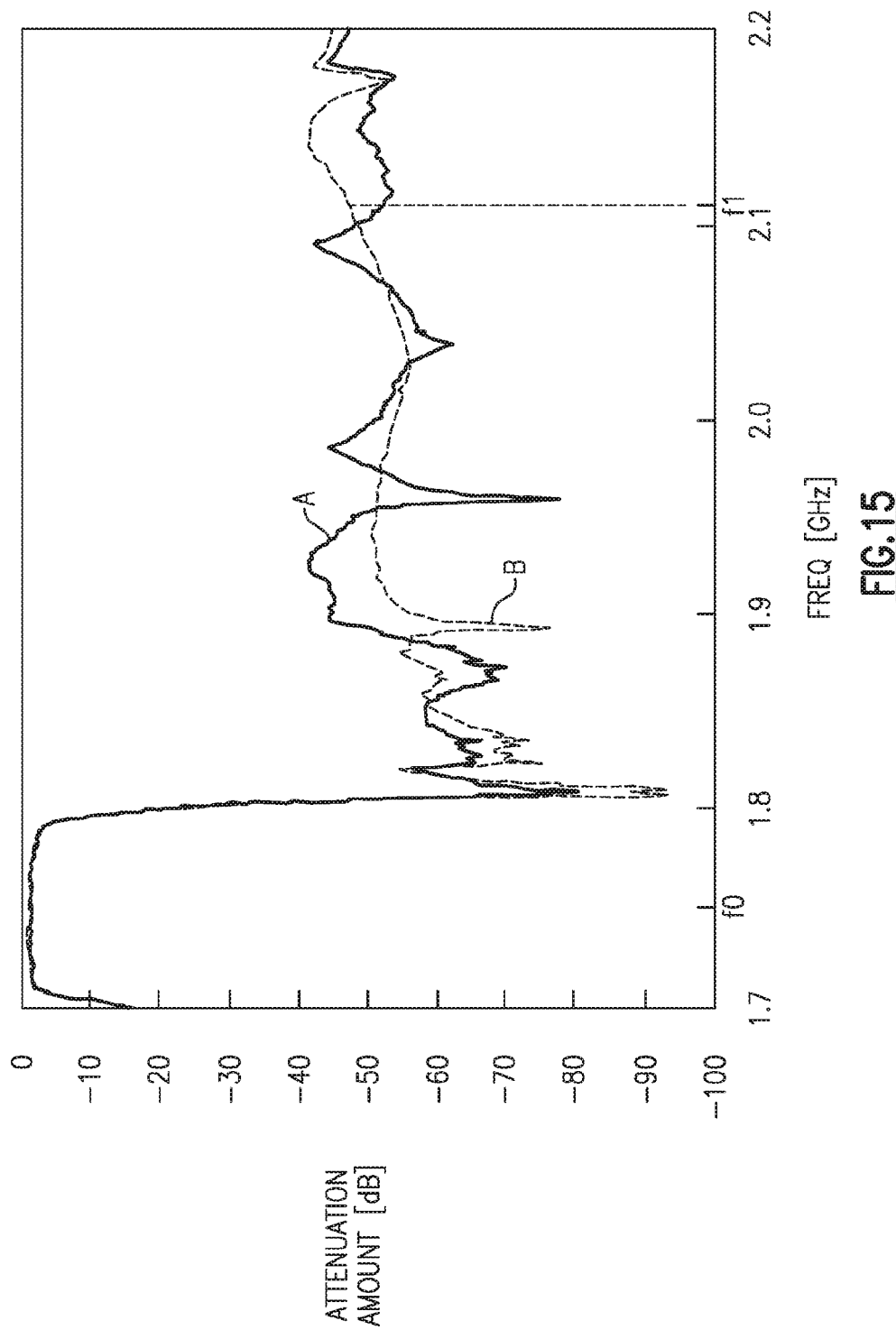
FIG. 15 is a graph illustrating simulated frequency characteristics of an example of the filter device of FIG. 14 according to aspects of the present invention.

FIG. 15 is a graph illustrating simulation results of frequency characteristics of the first filter 200 according to the ninth embodiment as shown in FIG. 14. In FIG. 15, curve A represents the amount of attenuation (in dB) for the ninth embodiment. Further, in FIG. 15, dashed curve B represents the amount of attenuation (in dB) for a comparative example in which the additional circuit 400 is removed from the filter device of the ninth embodiment.

As can be seen in FIG. 15, dashed curve B corresponding to the comparative example shows peaks where the attenuation amount is degraded due to a higher-order mode occurring in a frequency band (including a frequency f1), which is 1.2 to 1.3 times greater than the main mode (including a center frequency f0) of the first filter 200. In contrast, curve A corresponding to the ninth embodiment shows that the peaks due to the higher-order mode are suppressed and a certain attenuation amount is ensured. Therefore, according to the ninth embodiment, the attenuation characteristics may be improved in the first filter 200 and thus in the filter device 20. The ninth embodiment can be advantageous where the first filter 200 or the filter device 20 uses a TC-SAW in which a higher-order mode may occur, and can be applied to a communication of a bandwidth configured for CA because a reflection can be ensured in the frequency band 1.2 to 1.3 times greater than the main mode.

Figure 16:
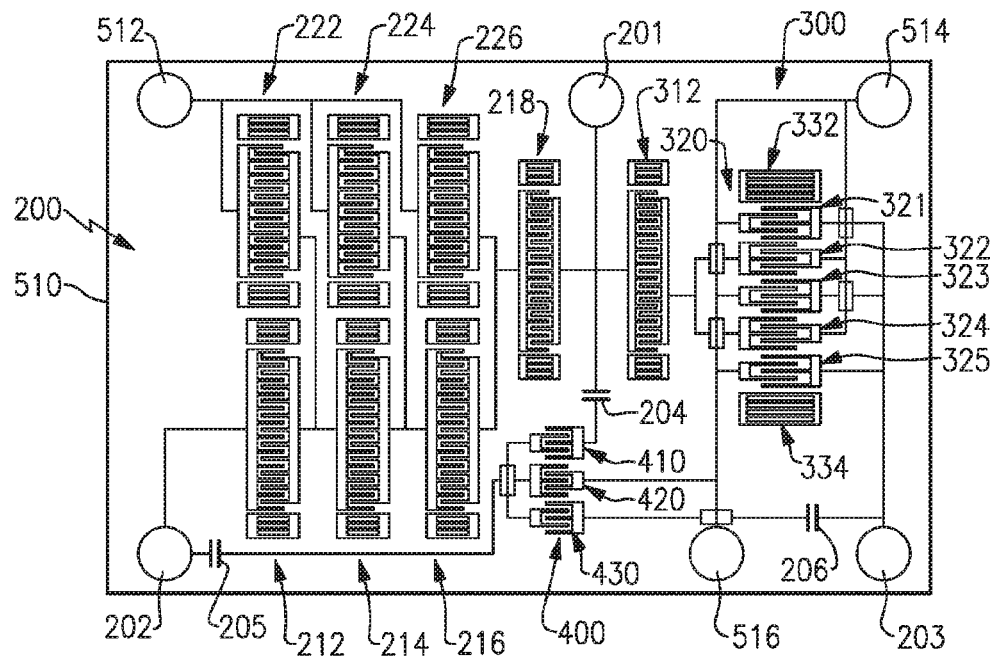
FIG. 16 is a diagram illustrating one example of a circuit layout of the filter device of FIG. 6 according to aspects of the present disclosure.

FIG. 16 illustrates a first example of a circuit layout of embodiments of the filter device 20. In this first example, the circuit layout can be realized by arranging the embodiment of the filter device 20 as shown in FIG. 6 on a single substrate 510 with surface acoustic wave elements. The substrate 510 can be formed in a substantial rectangular shape, in which the common terminal 201 is disposed slightly to the right than the center along the upper edge of the rectangular substrate 510 in FIG. 16. Further, as shown, the first terminal 202 can be disposed approximately at the lower left corner and the second terminal 203 can be disposed approximately at the lower right corner. Still further, the first ground terminal 512 can be disposed approximately at the upper left corner, the second ground terminal 514 can be disposed approximately at the upper right corner, and the third ground terminal 516 can be disposed approximately in the middle between the center of the lower edge and the lower right corner. All of these terminals can be formed as metal pads.

The first filter 200 configured as a ladder-type resonator can be disposed between the common terminal 201 and the first terminal 202. The first filter 200 can be disposed approximately on the left side where the first terminal 202 is formed on the substrate 510 with respect to the common terminal 201. In particular, the first to fourth resonators 212, 214, 216, 218 can be connected in series along a path extending from the first terminal 202 to the common terminal 201. Further, the fifth to seventh resonators 222, 224, 226 can be sequentially connected to respective branching nodes along the path that are disposed between respective adjacent resonators 212 and 214, 214 and 216, and 216 and 218. Each of the resonators 212-218 and 222-226 can be configured as a longitudinal-coupling-type acoustic wave resonator in which reflectors can be formed on the opposite sides in an acoustic wave propagation direction of respective IDT electrodes.

Still referring to FIG. 16, the second filter 300 including the eighth resonator 312 and the longitudinal-coupling-type filter 320 can be disposed between the common terminal 201 and the second terminal 203. The second filter 300 can be disposed approximately on the right side where the second terminal 203 is formed on the substrate 510 with respect to the common terminal 201. Similar to each resonator of the first filter 200, the eighth resonator 312 can be configured as a longitudinal-coupling-type acoustic wave resonator in which reflectors can be formed on the opposite sides in an acoustic wave propagation direction of respective IDT electrodes. In the longitudinal-coupling-type filter 320, the first to fifth IDT electrodes 321, 322, 323, 324, 325 can be sequentially disposed in an acoustic wave propagation direction. Further, the first reflector 332 and the second reflector 334 can be formed on the opposite sides in an acoustic wave propagation direction within the longitudinal-coupling-type filter 320.

In the longitudinal-coupling-type filter 320, one comb-shaped electrode included in each of the first IDT electrode 321, the third IDT electrode 323, and the fifth IDT electrode 325 can be connected to the second terminal 203, whereas one comb-shaped electrode included in each of the second IDT electrode 322 and the fourth IDT electrode 324 can be connected to the eighth resonator 312. Further, the other comb-shaped electrode included in each of the IDT electrodes can be connected to the second ground terminal 514 and the third ground terminal 516. Here, the polarity directions of the first IDT electrode 321, the third IDT electrode 323, and the fifth IDT electrode 325 can be configured opposed to the polarity direction of the second IDT electrode 322 and the fourth IDT electrode 324.

The additional circuit 400 can be disposed between the common terminal 201 and the first terminal 202 and between the common terminal 201 and the second terminal 203. The additional circuit 400 can be formed lower than approximate center on the substrate 510 as shown in FIG. 16. The additional circuit 400 can be configured such that the first to third IDT electrodes 410, 420, 430 can be sequentially disposed in an acoustic wave propagation direction. Further, one comb-shaped electrode of the first IDT electrode 410 can be connected to the common terminal 201 through the first capacitor 204, one comb-shaped electrode of the second IDT electrode 420 can be connected to the first terminal 202 through the second capacitor 205, and one comb-shaped electrode of the third IDT electrode 430 can be connected to the second terminal 203 through the third capacitor 206 respectively.

In certain examples the polarity directions of the first and third IDT electrodes 410, 430 can be configured opposed to the polarity direction of the second IDT electrode 420. The other comb-shaped electrode included in the second IDT electrode 420 can be connected to the third ground terminal 516. The other comb-shaped electrode included in each of the first and second IDT electrodes 410, 420 can be connected to another ground terminal than the third ground terminal 516 via a certain wiring (not shown).

The first capacitor 204 can be formed between the common terminal 201 and the additional circuit 400. Further, the second capacitor 205 can be formed between the first terminal 202 and the additional circuit 400 and the third capacitor 206 can be formed between the second terminal 203 and the additional circuit 400. In the example shown in FIG. 16, the second capacitor 205 is formed adjacent to the first terminal 202. Similarly, in the illustrated example, the third capacitor 206 is formed adjacent to the second terminal 203.

The circuit layout example as shown in FIG. 16 can be configured by ladder-type filters that can allow the first filter 200 to handle a signal of high intensity. Accordingly, this example of the circuit layout can be suitable for a duplexer into which a transmission signal of high intensity can be input. Further, the polarity directions of the first and third IDT electrodes 410, 430 can be configured opposed to the polarity direction of the second IDT electrode 420. Accordingly, respective distances from the common terminal 201, the first terminal 202, and the second terminal 203 to the additional circuit 400 can be shortened and the connection wirings can also be shortened such that the circuit configuration can be simplified for the device to be miniaturized.

Figure 17:
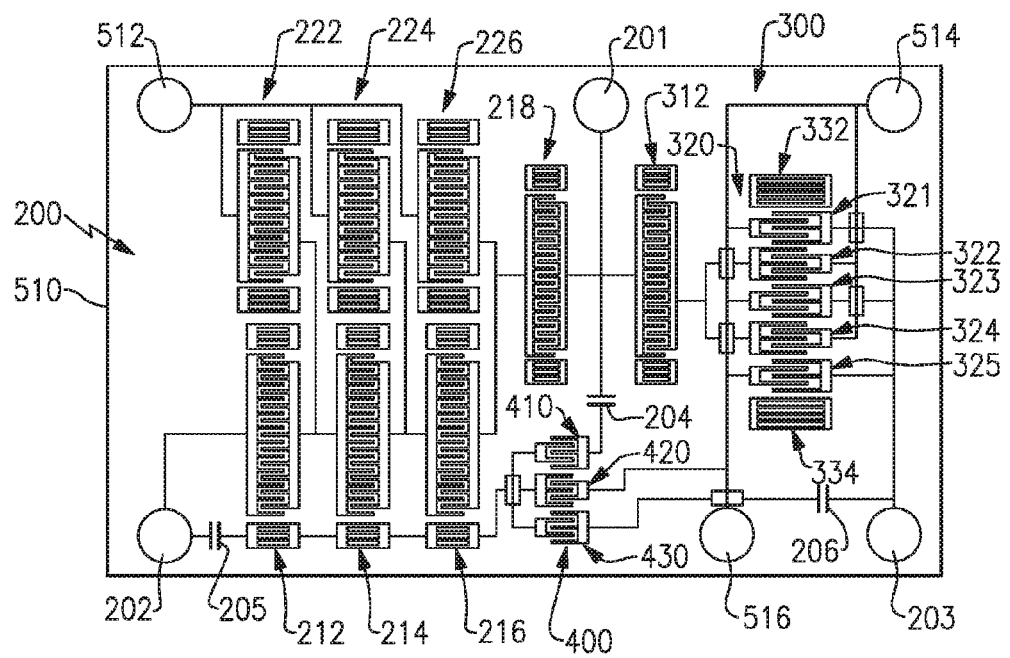
FIG. 17 is a diagram illustrating another example of a circuit layout of embodiments of the filter device according to aspects of the present invention.

FIG. 17 illustrates a second example of a circuit layout for embodiments of the filter device. This second example of the circuit layout is described below with reference to the drawings in which reference numerals common with the above-described embodiments indicate like elements for clarifying the correspondence relationship therebetween. Additional examples of circuit layouts are similarly described below.

Referring to FIG. 17, this example circuit layout is similar to the first example of the circuit layout as shown in FIG. 16 except that three reflectors disposed facing the lower edge of the substrate 510 among the reflectors included for the respective IDT electrodes in the first to third resonators 212, 214, 216 can be formed along a connection wiring extending from the first terminal 202 to the additional circuit 400 such that the three reflectors can be configured as portions of the connection wiring. The other configurations are the same as those of the circuit layout shown in FIG. 16.

In the example illustrated in FIG. 17, the circuit layout can allow the reflectors disposed on respective lower sides of the first to third resonators 212, 214, 216 in the drawing to be shared with the connection wiring extending between the first terminal 202 and the additional circuit 400 such that the circuit configuration can be simplified to miniaturize the device.

Figure 18:
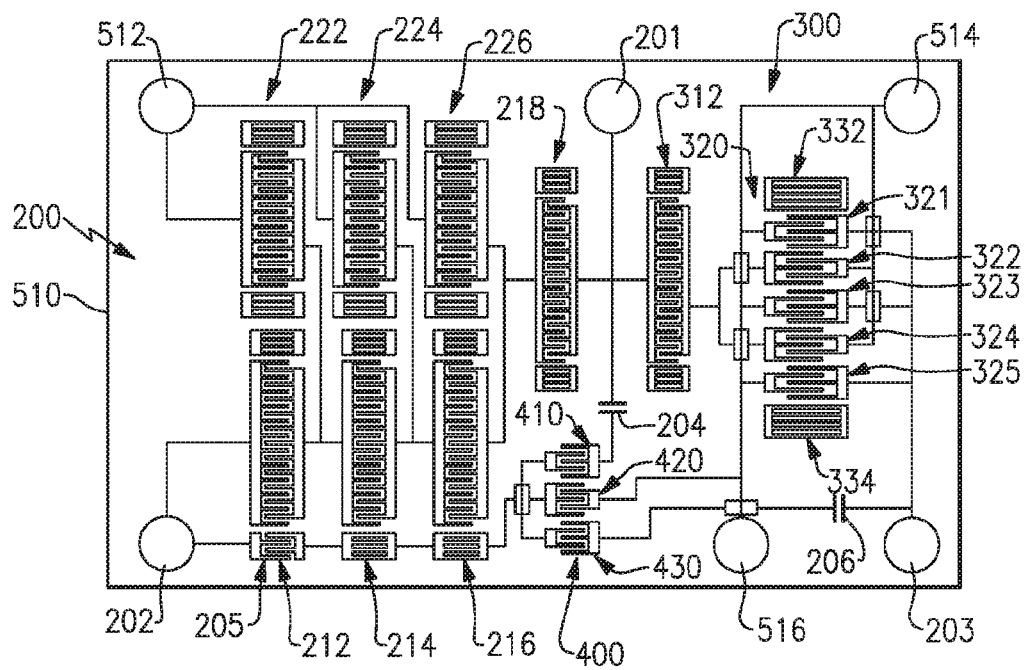
FIG. 18 is a diagram illustrating another example of a circuit layout of embodiments of the filter device according to aspects of the present invention.

FIG. 18 illustrates a third example of a circuit layout of embodiments of the filter device. This third example of the circuit layout is similar to the first circuit layout example as shown in FIG. 16, except that three reflectors disposed facing the lower edge of the substrate 510 for the first to third resonators 212, 214, 216 can be formed along a connection wiring extending from the first terminal 202 to the additional circuit 400 as portions of the connection wiring (similar to the second example of the circuit layout shown FIG. 17), and further the reflector disposed facing the lower edge can be configured to function as the second capacitor 205. The other configurations are the same as those of the first example shown in FIG. 16.

The third example of the circuit layout illustrated in FIG. 18 can allow the reflectors disposed on respective lower sides of the first to third resonators 212, 214, 216 in the drawing to be shared with the connection wiring extending between the first terminal 202 and the additional circuit 400, and also allow the reflector disposed on the lower side of the first resonator 212 to be shared with the second capacitor 205 such that the circuit configuration can be further simplified to miniaturize the device.

Figure 19:
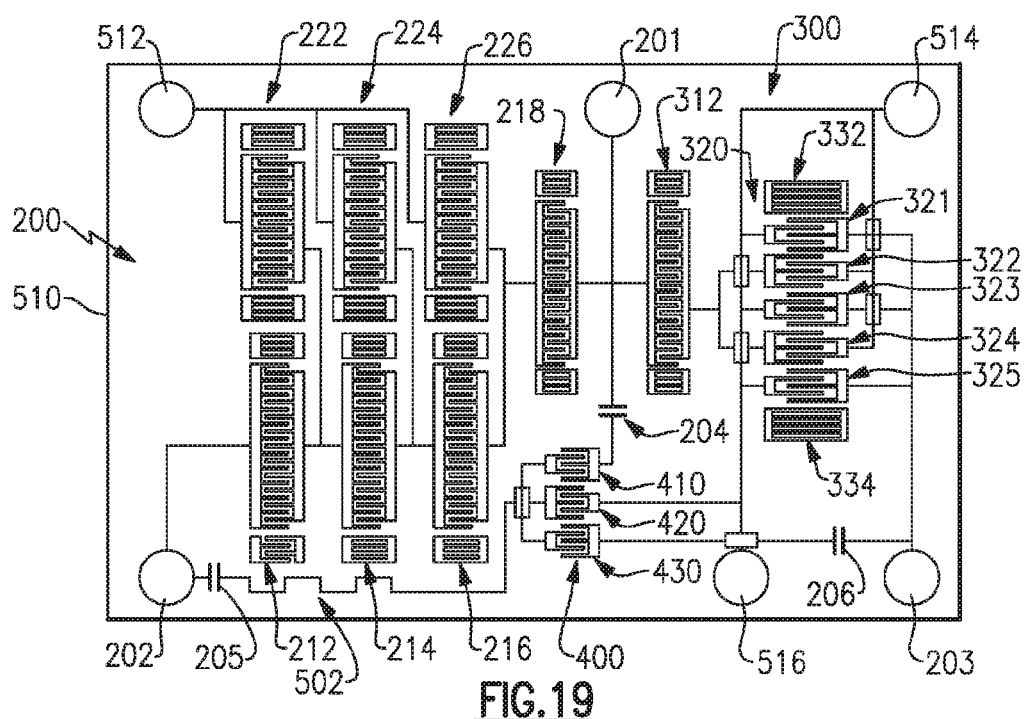
FIG. 19 is a diagram illustrating another example of a circuit layout of embodiments of the filter device according to aspects of the present invention.

FIG. 19 illustrates a fourth example of a circuit layout of embodiments of the filter device. In the fourth example shown in FIG. 19, the circuit layout can be configured to include only the second inductor component 502, but not to include the first inductor component 501 or the third inductor component 503 of the embodiment of the filter device as shown in FIG. 13 on a single substrate 510 with surface acoustic wave elements. This fourth example of the circuit layout is similar to the first example as shown in FIG. 16 except that at least three bent wiring portions can be formed between the second capacitor 205 and the additional circuit 400 along a connection wiring extending from the first terminal 202 to the additional circuit 400 to function as the second inductor component 502.

The fourth example of the circuit layout shown in FIG. 19 can allow the second inductor component 502 formed by the bent wiring portions to suppress harmonic waves such that the attenuation amount in the harmonic wave region can be suppressed to improve the attenuation and isolation characteristics.

Figure 20:
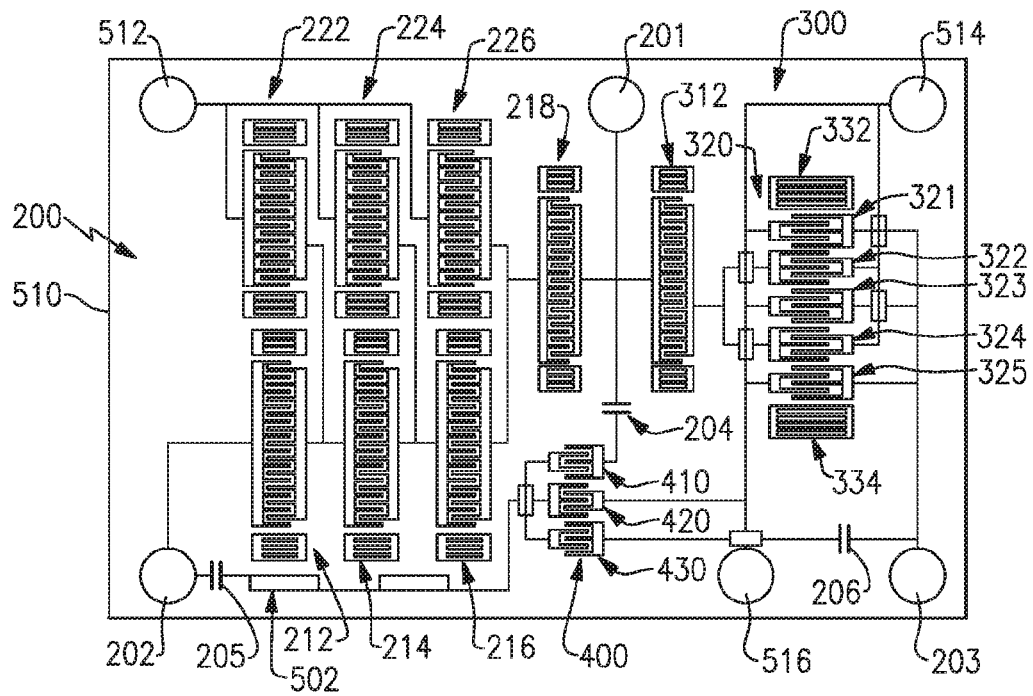
FIG. 20 is a diagram illustrating another example of a circuit layout of embodiments of the filter device according to aspects of the present invention.

FIG. 20 illustrates a fifth example of a circuit layout of embodiments of the filter device. This fifth example of the circuit layout is similar to the first example as shown in FIG. 16 except that the second inductor component 502 can be formed between the second capacitor 205 and the additional circuit 400 along the connection wiring extending from the first terminal 202 to the additional circuit 400 similar to the fourth circuit layout example shown in FIG. 19, but the second inductor component 502 can be configured as at least two portions having different line widths.

The fifth example circuit layout of FIG. 20 can allow the second inductor component 502 to be formed by the different line width portions such that the attenuation amount in the harmonic wave region can be suppressed to improve the attenuation and isolation characteristics. It is to be appreciated that the second inductor component 502 can be formed as at least two portions having different film thicknesses instead of the different line width portions along the connection wiring.

As described above, examples of the filter device 20 according to aspects and embodiments of the present disclosure can allow the additional circuit 400 to perform a phase control to generate a reversed phase signal with respect to the signal passing through the first or transmission filter 10 and/or the second or reception filter 20 across the suppression band R of the first or transmission filter 200 for both of the segment between the first terminal 202 as transmission terminal (Tx) and the common terminal 201 as antenna terminal (Ant) and the segment between the first terminal 202 as transmission terminal (Tx) and the second terminal 203 as reception terminal (Rx). Accordingly, because of the additional circuit 400 configured as described above, examples of the filter device according to the various aspects and embodiments disclosed herein can provide a duplexer having better attenuation and isolation characteristics.

Figure 21:
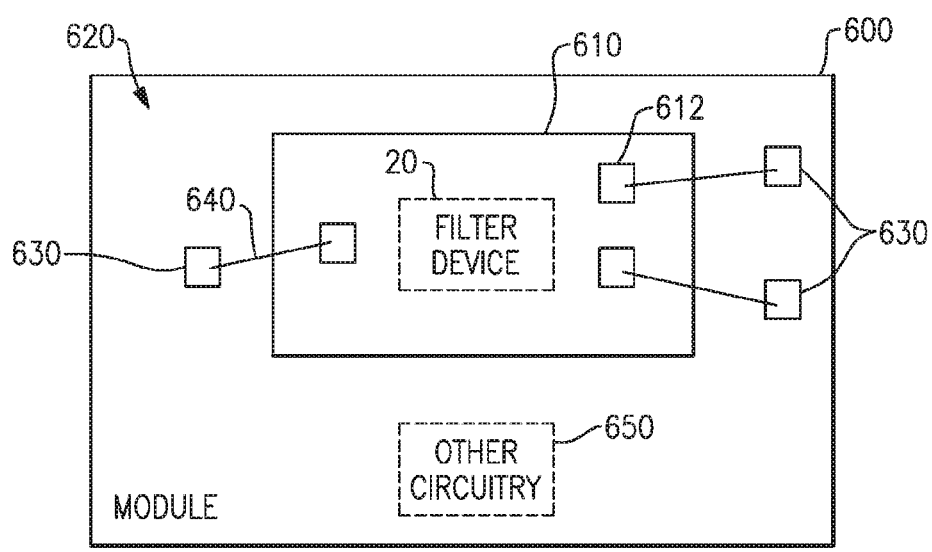
FIG. 21 is a block diagram of one example of a module including an embodiment of the filter device according to aspects of the present invention.

Further, embodiments of the filter device 20, or of a duplexer 30 or diplexer 40 including the filter device 20, may be incorporated into and packaged as a module that may ultimately be used in an electronic device, such as a wireless communications device, for example. FIG. 21 is a block diagram illustrating one example of a module 600 including the filter device 20. The filter device 20 may be implemented on one or more die(s) 610 including one or more connection pads 612. The packaged module 600 includes a packaging substrate 620 that is configured to receive a plurality of components, including the die 610. A plurality of connection pads 630 can be disposed on the packaging substrate 620, and the various connection pads 612 of the filter device die 610 can be connected to the connection pads 630 on the packaging substrate 620 via electrical connectors 640, which can be solder bumps or wirebonds, for example, to allow for passing of various signals to and from the filter device 20. The module 600 further includes other circuitry die 650, such as, for example amplifiers, pre-filters, modulators, demodulators, down converters, and the like, as would be known to one of skill in the art of semiconductor fabrication in view of the disclosure herein. In some embodiments, the module 600 can also include one or more packaging structures to, for example, provide protection and facilitate easier handling of the module 600. Such a packaging structure can include an overmold formed over the packaging substrate 620 and dimensioned to substantially encapsulate the various circuits and components thereon.

As will be appreciated by those skilled in the art, give the benefit of this disclosure, the filter device 20, or filter device die 610 in module 600, can be replaced by one or more dies or modules implementing the duplexer 30 or diplexer 40 discussed above to provide a duplexer module or diplexer module, respectively.

The filter device 20, duplexer 30, diplexer 40, or module 600 according to examples and embodiments disclosed herein may be useful in a variety of electronic devices, such as communications or wireless devices (e.g., cell phones, tablets, etc.).

Figure 22:
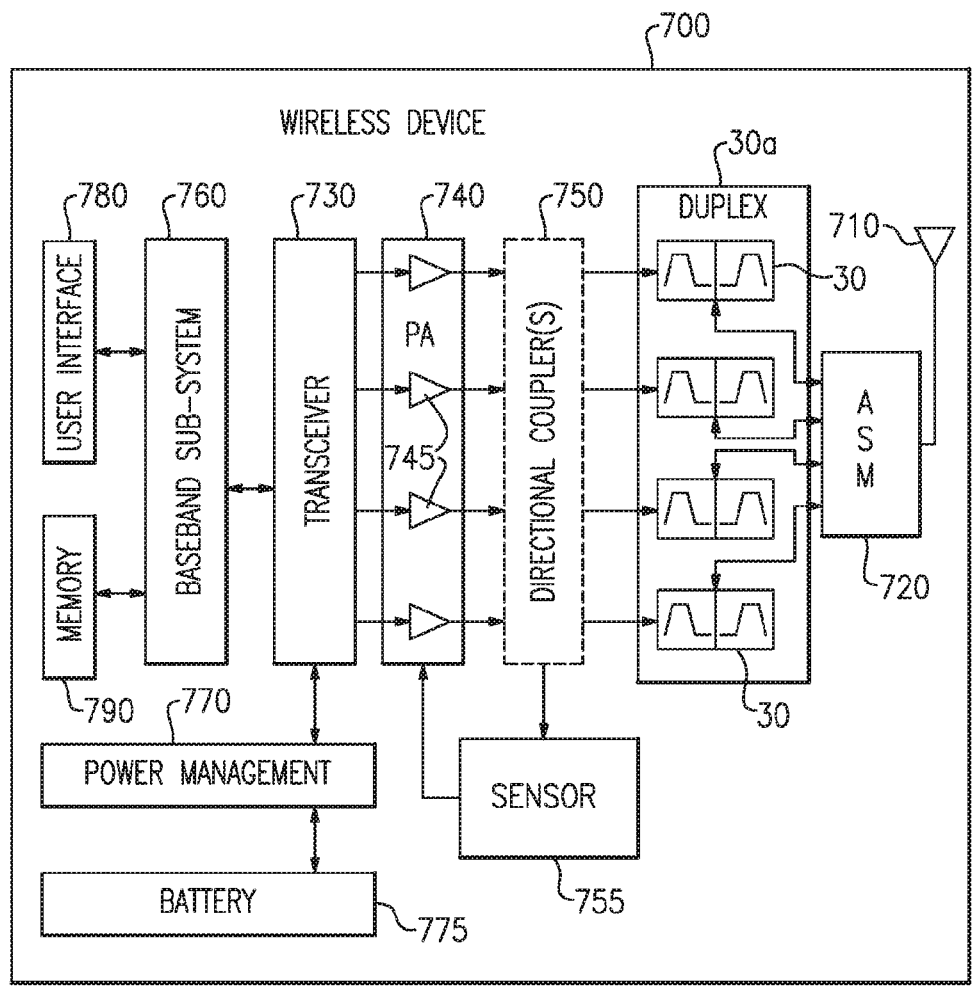
FIG. 22 is a block diagram of one example of an electronic device including an embodiment of a filter duplexer module implemented using the filter device according to aspects of the present invention.

FIG. 22 is a block diagram illustrating an example of an electronic device 700 that can include filter devices 20 having one or more features discussed herein. For instance, the electronic device 700 can include a filter device 20, duplexer 30, or diplexer 40 in accordance with any of the principles and advantages discussed above with reference to any of FIGS. 2-20. In the example illustrated in FIG. 22 the electronic device 700 includes a duplexer module 30a including four duplexers 30; however, as will be appreciated by those skilled in the art, a variety of other configurations can be implemented. The duplexer module 30a can allow transmit and receive operations to be performed simultaneously using a common antenna 710 connected to the duplexer module via an antenna switch module 720.

The electronic device 700 can be a mobile phone, such as a smart phone. The electronic device 700 can include elements that are not illustrated in FIG. 22 and/or a sub-combination of the illustrated elements. The electronic device 700 depicted in FIG. 22 can represent a multi-band and/or multi-mode device such as a multi-band/multi-mode mobile phone. By way of example, the electronic device 700 can be a wireless device that communicates in accordance with Long Term Evolution (LTE). In this example, the electronic device 700 can be configured to operate at one or more frequency bands defined by an LTE standard. The electronic device 700 can alternatively or additionally be configured to communicate in accordance with one or more other communication standards, including but not limited to one or more of a Wi-Fi standard, a Bluetooth standard, a 3G standard, a 4G standard or an Advanced LTE standard. A number of other wireless device configurations can use one or more features described herein. For example, a wireless device may not necessarily be a multi-band device. In another example, a wireless device can include additional antennas such as diversity antenna, and additional connectivity features such as Wi-Fi, Bluetooth, and GPS.

The electronic device 700 includes a transceiver 730, which in one example can include the transmission circuitry 32 and reception circuitry 34 discussed above. The transceiver 730 is configured to generate signals for transmission and/or to process received signals. It will be understood that various functionalities associated with the transmission and receiving of RF signals can be achieved by one or more components that are represented in FIG. 22 as the transceiver 730. For example, a single component can be configured to provide both transmitting and receiving functionalities. In another example, transmitting and receiving functionalities can be provided by separate components. Similarly, it will be understood that various antenna functionalities associated with the transmission and receiving of RF signals can be achieved by one or more components that are collectively represented in FIG. 22 as the antenna 710. For example, a single antenna 710 can be configured to provide both transmitting and receiving functionalities, as shown in FIG. 22. In another example, transmitting and receiving functionalities can be provided by separate antennas. In yet another example in which the communication device is a multi-band device, different bands associated with the electronic device 700 can be provided with different antennas.

Signals generated for transmission are received by the power amplifier (PA) module 740, which amplifies the generated signals from the transceiver 730. As will be appreciated by those skilled in the art, the power amplifier module 110 can include one or more power amplifiers 745. The power amplifier module 740 can be used to amplify a wide variety of RF or other frequency-band transmission signals. For example, the power amplifier module 740 can receive an enable signal that can be used to pulse the output of the power amplifier to aid in transmitting a wireless local area network (WLAN) signal or any other suitable pulsed signal. The power amplifier module 740 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 740 and associated components including switches and the like can be fabricated on GaAs substrates using, for example, pHEMT or BiFET transistors, or on a Silicon substrate using CMOS transistors.

The electronic device 700 may optionally include one or more directional coupler(s) 750 for measuring transmitted power signals from the power amplifier module 740 and for providing one or more coupled signals to a sensor module 755. The sensor module 755 can in turn send information to the transceiver 730 and/or directly to the power amplifier module 740 as feedback for making adjustments to regulate the power level of the power amplifier module 740.

In certain embodiments in which the electronic device 700 is a mobile phone having a time division multiple access (TDMA) architecture, the directional coupler(s) 750 can advantageously manage the amplification of an RF transmitted power signal from the power amplifier module 740. In a mobile phone having a time division multiple access (TDMA) architecture, such as those found in Global System for Mobile Communications (GSM), code division multiple access (CDMA), and wideband code division multiple access (W-CDMA) systems, the power amplifier module 740 can be used to shift power envelopes up and down within prescribed limits of power versus time. For instance, a particular mobile phone can be assigned a transmission time slot for a particular frequency channel. In this case the power amplifier module 740 can be employed to aid in regulating the power level one or more RF power signals over time, so as to prevent signal interference from transmission during an assigned receive time slot and to reduce power consumption. In such systems, the directional coupler (s) 750 can be used to measure the power of a power amplifier output signal to aid in controlling the power amplifier module 740, as discussed above.

Still referring to FIG. 22, the transceiver 730 is shown to interact with a baseband sub-system 760 that is configured to provide conversion between data and/or voice signals suitable for a user and RF signals suitable for the transceiver 730. The electronic device 700 further includes a power management system 770 that is connected to the transceiver 730 and that manages the power for the operation of the electronic device. The power management system 770 can also control the operation of the baseband sub-system 760 and other components of the electronic device 700. The power management system 770 can be connected to a battery 775 that supplies power for the various components of the electronic device 700. The battery 780 can be any suitable battery for use in the electronic device 700, including, for example, a lithium-ion battery.

In one embodiment, the baseband sub-system 760 is connected to a user interface 780 to facilitate various input and output of voice and/or data provided to and received from the user. The baseband sub-system 760 can also be connected to memory 790 that is configured to store data and/or instructions to facilitate the operation of the electronic device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A filter device having a common terminal, a first terminal, and a second terminal, the filter device comprising:
   a first filter including a plurality of first filter elements connected in series between the common terminal and the first terminal;
   a second filter including a plurality of second filter elements connected in series between the common terminal and the second terminal; and
   an additional circuit including at least three interdigital transducer (IDT) electrodes each connected to a respective one of a corresponding at least three connection points within the filter device, the at least three connection points being selected from a group consisting of the common terminal, the first terminal, the second terminal, a first node disposed between the plurality of first filter elements along a path extending between the common terminal and the first terminal, and a second node disposed between the plurality of second filter elements along a path extending between the common terminal and the second terminal.

2. The filter device of claim 1 wherein the first filter has a first passband, and the second filter had a second passband that does not overlap the first passband.

3. The filter device of claim 2 further comprising at least three capacitors each connected between a respective one of the at least three connection points and the additional circuit.

4. The filter device of claim 1 wherein the at least three connection points include the first terminal, the second terminal, and the common terminal, and the at least three IDT electrodes include a first IDT electrode connected to the common terminal, a second IDT electrode connected to the first terminal, and a third IDT electrode connected to the second terminal.

5. The filter device of claim 4 further comprising at least one of a first capacitor connected between the common terminal and the first IDT electrode, a second capacitor connected between the first terminal and the second IDT electrode, and a third capacitor connected between the second terminal and the third IDT electrode.

6. The filter device of claim 4 wherein the first and third IDT electrodes are disposed in an electrode polarity direction opposite to that of the second IDT electrode.

7. The filter device of claim 6 wherein the first, second, and third IDT electrodes are disposed in an electrode polarity direction identical to one another.

8. The filter device of claim 4 wherein the at least three IDT electrodes of the additional circuit further include a fourth IDT electrode connected to the first terminal.

9. The filter device of claim 8 wherein the second and fourth IDT electrodes are disposed in an electrode polarity direction opposite to that of the first and third IDT electrodes.

10. The filter device of claim 8 wherein the least three IDT electrodes of the additional circuit further include a fifth IDT electrode connected to the common terminal.

11. The filter device of claim 1 wherein the additional circuit includes a pair of reflectors disposed outside the at least three IDT electrodes.

12. The filter device of claim 11 wherein the pair of reflectors is disposed oblique with respect to a polarity direction of the at least three IDT electrodes.

13. The filter device of claim 1 wherein the at least three IDT electrodes of the additional circuit include a first IDT electrode connected to the common terminal, a second IDT electrode connected to the first node, and a third IDT electrode connected to the second terminal.

14. The filter device of claim 1 wherein the at least three IDT electrodes of the additional circuit include a first IDT electrode connected to the first node, a second IDT electrode connected to the first terminal, a third IDT electrode connected to the common terminal, and a fourth IDT electrode connected to the first terminal.

15. The filter device of claim 14 wherein at least one of the first plurality of filter elements is a resonator including an IDT electrode, and wherein an electrode finger pitch of the IDT electrodes of the additional circuit is 1/1.2 to 1/1.3 times an electrode finger pitch of the IDT electrode of the resonator.

16. The filter device of claim 15 wherein the first and third IDT electrodes are disposed to have a polarity direction opposite to that of the second and fourth IDT electrodes.

17. The filter device of claim 14 further comprising a first capacitor connected between the first node and the first IDT electrode, a second capacitor connected between the first terminal and the second and fourth IDT electrodes, and a third capacitor connected between the common terminal and the third IDT electrode.

18. A communications device comprising:
   an antenna;
   reception circuitry;

transmission circuitry; and
a duplexer module including an antenna duplexer having a first terminal connected to the transmission circuitry, a second terminal connected to the reception circuitry, and a common terminal connected to the antenna, the antenna duplexer including a transmission filter having a plurality of first filter elements connected in series between the common terminal and the first terminal, a reception filter having a plurality of second filter elements connected in series between the common terminal and the second terminal, and an additional circuit including at least three interdigital transducer (IDT) electrodes each connected to a respective one of a corresponding at least three connection points within the antenna duplexer, the at least three connection points being selected from a group consisting of the common terminal, the first terminal, the second terminal, a first node disposed between the plurality of first filter elements along a path extending between the common terminal and the first terminal, and a second node disposed between the plurality of second filter elements along a path extending between the common terminal and the second terminal.

19. The communications device of claim 18 further comprising at least one capacitor connected between one of the at least three connection points and the additional circuit.

20. The communications device of claim 19 wherein each of the transmission filter and the reception filter is one of a ladder-type filter and a longitudinal-coupling-type filter.

\* \* \* \* \*

UNITED STATES PATENT AND TRADEMARK OFFICE
CERTIFICATE OF CORRECTION

PATENT NO. : 10,135,422 B2
APPLICATION NO. : 15/281286
DATED : November 20, 2018
INVENTOR(S) : Rei Goto et al.

Page 1 of 1

It is certified that error appears in the above-identified patent and that said Letters Patent is hereby corrected as shown below:

In the Claims

Column 28, Claim 7, Line number 20, delete "6" and insert -- 4 --.

Column 28, Claim 15, Line number 51, delete "first" between "the" and "plurality".

Column 28, Claim 15, Line number 51, insert -- first -- between "of" and "filter".

Signed and Sealed this
Third Day of September, 2019

Andrei Iancu
*Director of the United States Patent and Trademark Office*